US012684793B2

(12) United States Patent
Ogata et al.

(10) Patent No.: US 12,684,793 B2
(45) Date of Patent: Jul. 14, 2026

(54) SEMICONDUCTOR DEVICE INCLUDING A GATE ELECTRODE FORMED IN A TRENCH AND METHOD OF MANUFACTURING THE SAME

(71) Applicant: RENESAS ELECTRONICS CORPORATION, Tokyo (JP)

(72) Inventors: Koji Ogata, Tokyo (JP); Tetsuya Yoshida, Tokyo (JP); Yukio Takahashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 597 days.

(21) Appl. No.: 18/185,065

(22) Filed: Mar. 16, 2023

(65) Prior Publication Data

US 2023/0411502 A1    Dec. 21, 2023

(30) Foreign Application Priority Data

May 20, 2022    (JP) ................................. 2022-083033

(51) Int. Cl.
| | |
|---|---|
| *H10D 12/00* | (2025.01) |
| *H10D 12/01* | (2025.01) |
| *H10D 62/10* | (2025.01) |

(52) U.S. Cl.
CPC ......... *H10D 12/481* (2025.01); *H10D 12/038* (2025.01); *H10D 62/127* (2025.01)

(58) Field of Classification Search
CPC .. H10D 12/031; H10D 12/032; H10D 12/035; H10D 12/038; H10D 12/441; H10D 12/461; H10D 12/481; H10D 62/127; H10D 62/145; H10D 62/393; H10D 64/232; H10D 64/519
See application file for complete search history.

(56) References Cited

U.S. PATENT DOCUMENTS

| | | | |
|---|---|---|---|
| 9,023,692 | B2 | 5/2015 | Yoshida et al. |
| 9,041,050 | B2 | 5/2015 | Matsuura |
| 9,099,522 | B2 | 8/2015 | Onozawa |
| 10,186,608 | B2 | 1/2019 | Naito |
| 11,127,844 | B2 | 9/2021 | Abe et al. |

(Continued)

FOREIGN PATENT DOCUMENTS

| | | |
|---|---|---|
| JP | 2004-119616 A | 4/2004 |
| JP | 2005-26391 A | 1/2005 |

(Continued)

OTHER PUBLICATIONS

Notice of Reasons for Refusal received in corresponding Japanese Patent Application No. 2022-083033, dated Apr. 30, 2025.

*Primary Examiner* — Eric A. Ward
(74) *Attorney, Agent, or Firm* — Rimon P.C.

(57) ABSTRACT

A semiconductor device includes an n-type semiconductor substrate, a trench, a gate electrode formed in the trench via the gate insulating film, a p-type base region formed in the semiconductor substrate, and an n-type emitter region formed in the base region. The trench extends in a Y direction, in a plan view. Adjacent ones of a plurality of emitter regions are formed to be spaced apart from each other by a distance, along the Y direction. The distance is wider than $\frac{1}{5}$ of a width of each of the emitter regions in the Y direction and narrower than the width.

6 Claims, 22 Drawing Sheets

A-A CROSS-SECTION

(56) References Cited

U.S. PATENT DOCUMENTS

| | | | | |
|---|---|---|---|---|
| 2004/0082136 A1* | 4/2004 | Hutcheson | ........... | H10D 62/137 |
| | | | | 257/E21.375 |
| 2013/0082302 A1* | 4/2013 | Nakamura | ........... | H10D 64/252 |
| | | | | 257/155 |
| 2015/0380537 A1 | 12/2015 | Kato | | |
| 2019/0181254 A1* | 6/2019 | Nagata | ................... | H10D 64/23 |
| 2022/0173231 A1* | 6/2022 | Nakatani | .............. | H10D 62/127 |

FOREIGN PATENT DOCUMENTS

| | | | |
|---|---|---|---|
| JP | 2007-59722 A | 3/2007 | |
| JP | 2008-177279 A | 7/2008 | |
| JP | WO2011/111500 A1 | 9/2011 | |
| JP | 2013-140885 A | 7/2013 | |
| JP | 2014-75582 A | 4/2014 | |
| JP | WO2014/128914 A1 | 8/2014 | |
| JP | WO2016/125490 A1 | 8/2016 | |
| JP | WO2017/006711 A1 | 1/2017 | |

* cited by examiner

A–A CROSS–SECTION

A–A CROSS–SECTION

A–A CROSS-SECTION

A–A CROSS-SECTION

A-A CROSS-SECTION

A-A CROSS-SECTION

A-A CROSS-SECTION

<FIRST EMBODIMENT>

B-B CROSS-SECTION (CASE 1)

B-B CROSS-SECTION (CASE 2)

B-B CROSS-SECTION (CASE 3)

B-B CROSS-SECTION (CASE 4)

<SECOND EMBODIMENT>

B-B CROSS-SECTION

C–C CROSS–SECTION

SEMICONDUCTOR DEVICE INCLUDING A GATE ELECTRODE FORMED IN A TRENCH AND METHOD OF MANUFACTURING THE SAME

CROSS-REFERENCE TO RELATED APPLICATIONS

The disclosure of Japanese Patent Application No. 2022-083033 filed on May 20, 2022 including the specification, drawings and abstract is incorporated herein by reference in its entirety.

BACKGROUND

The present invention relates to a semiconductor device and a method of manufacturing the same, and particularly to a semiconductor device including a gate electrode formed in a trench and a method of manufacturing the same.

As an IGBT (Insulated Gate Bipolar Transistor) with low on-resistance, a trench gate IGBT has been widely used.

There are disclosed techniques listed below.
[Patent Document 1] Japanese Unexamined Patent Application Publication No. 2013-140885

For example, Patent Document 1 discloses an IGBT having a GGEE structure. In such an IGBT, a trench is formed in an n-type semiconductor substrate, and a gate electrode is buried in the trench with a gate insulating film interposed between the gate electrode and the trench. In addition, a p-type base region is formed in the semiconductor substrate, and an n-type emitter region is formed on the upper side of the p-type base region. The base region and the emitter region are formed by ion implantation in such a state in which an insulating film different from the gate insulating film is formed on the semiconductor substrate.

SUMMARY

In a conventional technique, a gate insulating film is formed in a trench and on a semiconductor substrate, a polycrystalline silicon film is deposited on the gate insulating film, and the polycrystalline silicon film is subjected to dry etching. Accordingly, the polycrystalline silicon film on the semiconductor substrate is removed, and the polycrystalline silicon film is buried in the trench as a gate electrode. When the ion implantation is performed on the semiconductor substrate, in order to reduce damage to the semiconductor substrate, the gate insulating film on the semiconductor substrate is used as a through film.

However, a thickness of the gate insulating film is relatively large, resulting in variation in thickness of the gate insulating film at a time of forming the gate insulating film and at a time of a process of dry etching on the polycrystalline silicon film. Hence, as Patent Document 1, the gate insulating film on the semiconductor substrate is removed, and a reoxidation treatment is performed on the semiconductor substrate. Consequently, it is effective to newly form another silicon oxide film on the semiconductor substrate. With this newly formed silicon oxide film as a through film, ion implantation is performed on the semiconductor substrate, so that a base region and an emitter region are formed in the semiconductor substrate. Note that the reoxidation treatment is a thermal oxidation treatment using oxygen gas, generally called a dry oxidation treatment.

Here, according to study by the inventors of the present application, it was found out that, when the reoxidation treatment is performed, an interface state increases, and hydrogen ions are formed in the gate insulating film, PBTI (Positive Bias Temperature Instability) degrades. Degradation of PBTI causes such a defect that fluctuation in threshold voltage occurs as time passes. Specifically, the reliability of the semiconductor device is lowered.

Meanwhile, in the semiconductor device, short circuit withstand time (a period of time for which the semiconductor device is yet to be broken due to latch-up in a state in which a current flows until a collector current is saturated) is used as one of indices for evaluation of products. In order to achieve high performance of the semiconductor device, the current needs to be increased, but the short circuit withstand time is reduced with increased current. In this case, an interval between adjacent ones of emitter regions is narrower, and an area of each emitter region along the gate electrode is large, making the degradation of PBTI conspicuous.

A main object of the present application is to achieve both prevention of fluctuation in threshold voltage resulting from degradation of PBTI and enhancement of short circuit withstand time. This makes it possible to secure the reliability of a semiconductor device and to improve the performance of a semiconductor device. Other objects and novel features of the present application will be apparent from the description of the present specification and the accompanying drawings.

Outlines of the typical ones of the embodiments disclosed in the present application will briefly be described as follows.

A semiconductor device according to one embodiment includes a semiconductor substrate of a first conductivity type, a first trench formed in the semiconductor substrate, a first gate insulating film formed in the first trench, a first gate electrode formed on the first gate insulating film so as to bury an interior of the first trench, a base region of a second conductivity type which is an opposite conductivity type to the first conductivity type, the base region being formed in the semiconductor substrate such that a bottom portion of the base region is shallower than a bottom portion of the first trench, and a plurality of emitter regions of the first conductivity type formed in the base region. Here, the first trench extends in a first direction, in a plan view, adjacent ones of the plurality of emitter regions are spaced apart from each other by a first distance along the first direction, each of the plurality of emitter regions has a first width in the first direction, and the first distance is wider than ⅓ of the first width and narrower than the first width.

A method of manufacturing a semiconductor device according to one embodiment includes: (a) preparing a semiconductor substrate of a first conductivity type, (b) after the (a), forming a first trench in the semiconductor substrate, (c) after the (b), forming a first gate insulating film in the first trench and on the semiconductor substrate, (d) after the (c), forming a first conductive film on the first gate insulating film so as to bury an interior of the first trench, (e) after the (d), removing the first conductive film formed outside the first trench, thereby forming a first gate electrode formed of the first conductive film in the first trench, (f) after the (e), removing the first gate insulating film formed on the semiconductor substrate, (g) after the (f), forming a first insulating film on the semiconductor substrate, (h) after the (g), forming a base region of a second conductivity type which is an opposite conductivity type to the first conductivity type in the semiconductor substrate by ion implantation such that a bottom portion of the base region is shallower than a bottom portion of the first trench, and (i) after the (h), forming a plurality of emitter regions of the first conductivity type in the base region by ion implantation. Here, the first trench extends in a first direction, in a plan view, in the (i), adjacent ones of the plurality of emitter regions are formed so as to be spaced apart from each other by a first distance in the first direction, each of the plurality of emitter regions has a first width in the first direction, and the first distance is wider than 1/5 of the first width and narrower than the first width.

According to one embodiment, it is possible to secure the reliability of a semiconductor device and to improve the performance of a semiconductor device.

DETAILED DESCRIPTION

Hereinafter, embodiments of the present application will be described in detail with reference to the accompanying drawings. Note that components having the same function are denoted by the same reference symbols throughout the drawings for describing the embodiments, and the repetitive description thereof is omitted. In addition, the description of the same or similar portions is not repeated in principle unless particularly required in the following embodiments.

In addition, an X direction, a Y direction, and a Z direction described in the present application intersect with and orthogonal to each other. In the present application, the Z direction is used as a vertical direction, a height direction, or a thickness direction of a structural element for description. In addition, a "plan view," "in a plan view," or the similar expressions used in the present application means that a plane formed by the X direction and the Y direction as a "plane," and this "plane" is viewed from the Z direction.

First Embodiment

Structure of Semiconductor Device

A structure of a semiconductor device 100 according to the first embodiment will be described below with reference to FIG. 1 to FIG. 3. A main feature of the first embodiment lies in a structure of an emitter region NE formed along a gate electrode GE1. Such a feature will be described below in details with reference to FIG. 18 to FIG. 22. Before describing the feature, the entire structure of the semiconductor device 100 and a method of manufacturing the same will be described.

Figure 1:
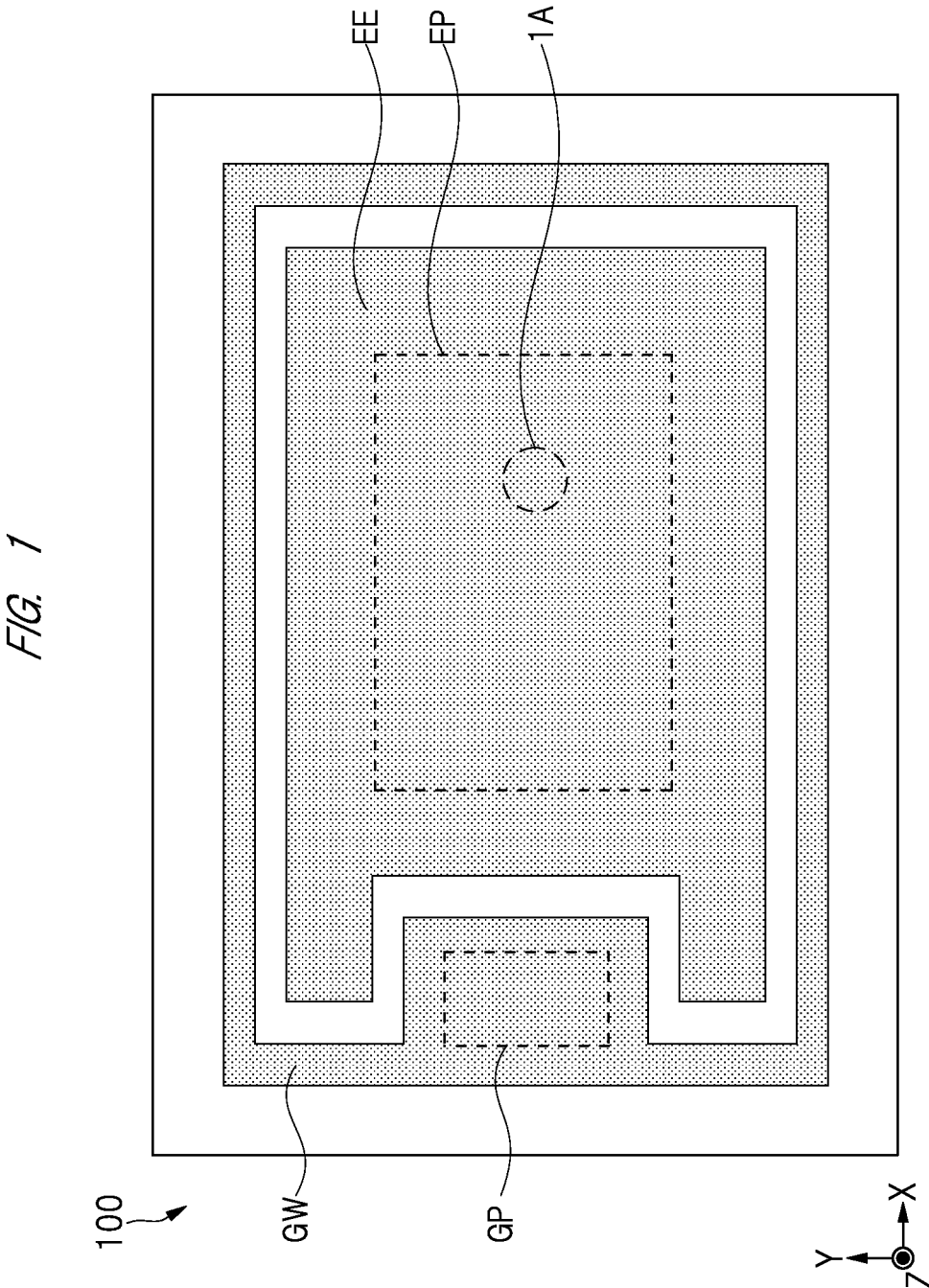
FIG. 1 is a plan view showing a semiconductor device according to a first embodiment.

FIG. 1 is a plan view showing a semiconductor chip that is the semiconductor device 100. As shown in FIG. 1, major part of the semiconductor device 100 is covered with an emitter electrode EE. A gate wiring GW is formed in the outer periphery of the emitter electrode EE.

Part of each of the emitter electrode EE and the gate wiring GW is covered with a protective film not illustrated. Respective regions which are exposed from this protective film are an emitter pad EP and a gate pad GP. An external connection member such as a wire bonding or a clip (cupper plate) is connected on the emitter pad EP and on the gate pad GP, so that the semiconductor device 100 is electrically connected to another semiconductor chip, a wiring substrate, or the like.

Figure 2:
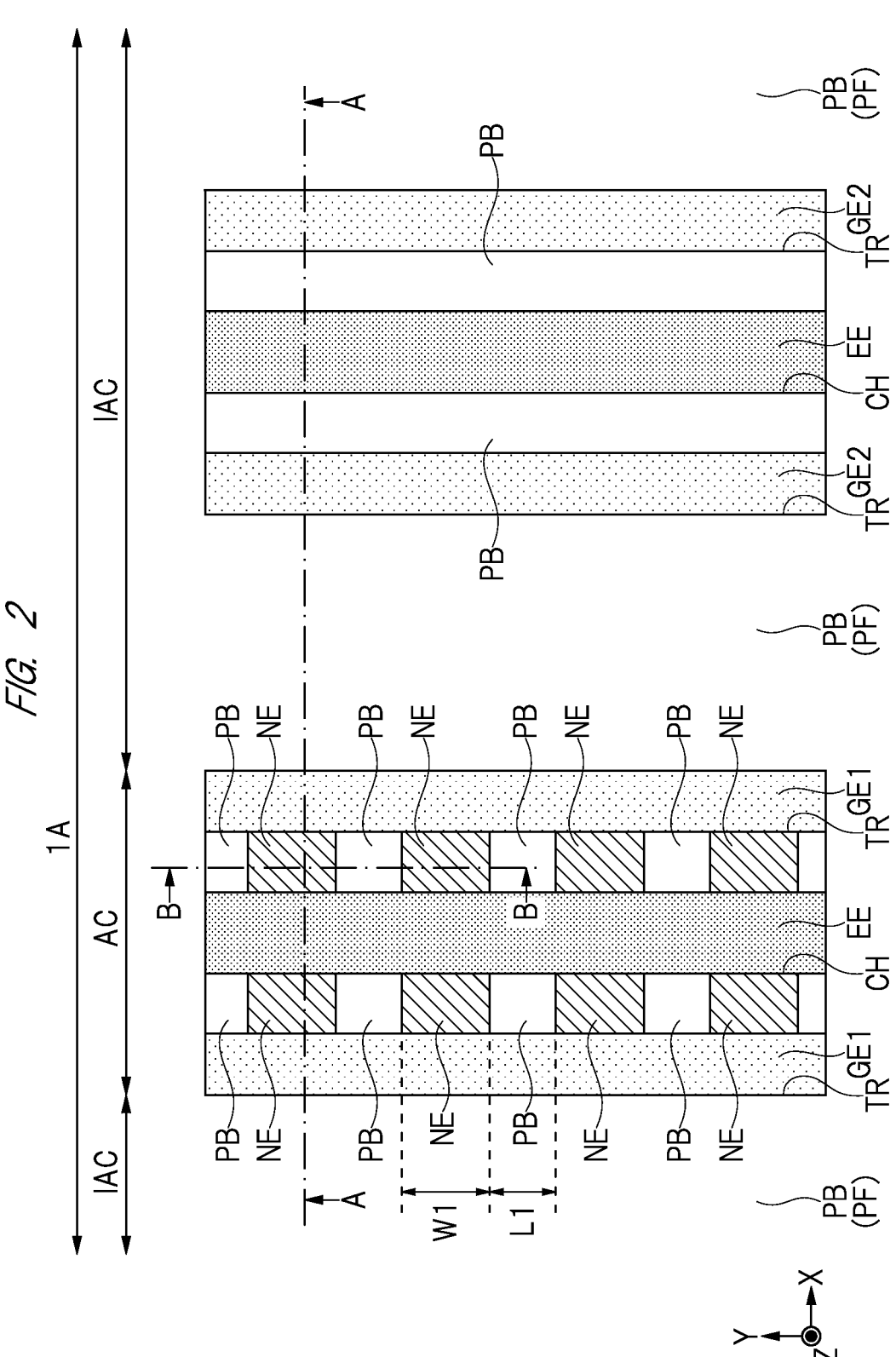
FIG. 2 is a plan view showing a main part of the semiconductor device according to the first embodiment.

FIG. 2 is a plan view showing a main part corresponding to a cell region 1A shown in FIG. 1. In the cell region 1A, a semiconductor element such as an IGBT is formed. The IGBT shown in FIG. 2 is an IGBT of a GGEE structure and is an IE type IGBT capable of using an IE (Injection Enhancement) effect.

The IE effect is a technique in which positive holes are made to be hardly discharged from the emitter electrode EE side when the IGBT is in an on state to thereby increase a concentration of electric charges accumulated in a drift region NV. Accordingly, the semiconductor device 100 has an active cell AC which performs main operation of the IGBT, and an inactive cell IAC other than the active cell AC. The gate electrode GE1 of the active cell AC is electrically connected to the gate wiring GW, and at a time of operation of the IGBT, a gate potential is supplied to the gate electrode GE1. The gate electrode GE2 of the inactive cell IAC is electrically connected to the emitter electrode EE, and at a time of operation of the IGBT, an emitter potential is supplied to the gate electrode GE2.

Figure 3:
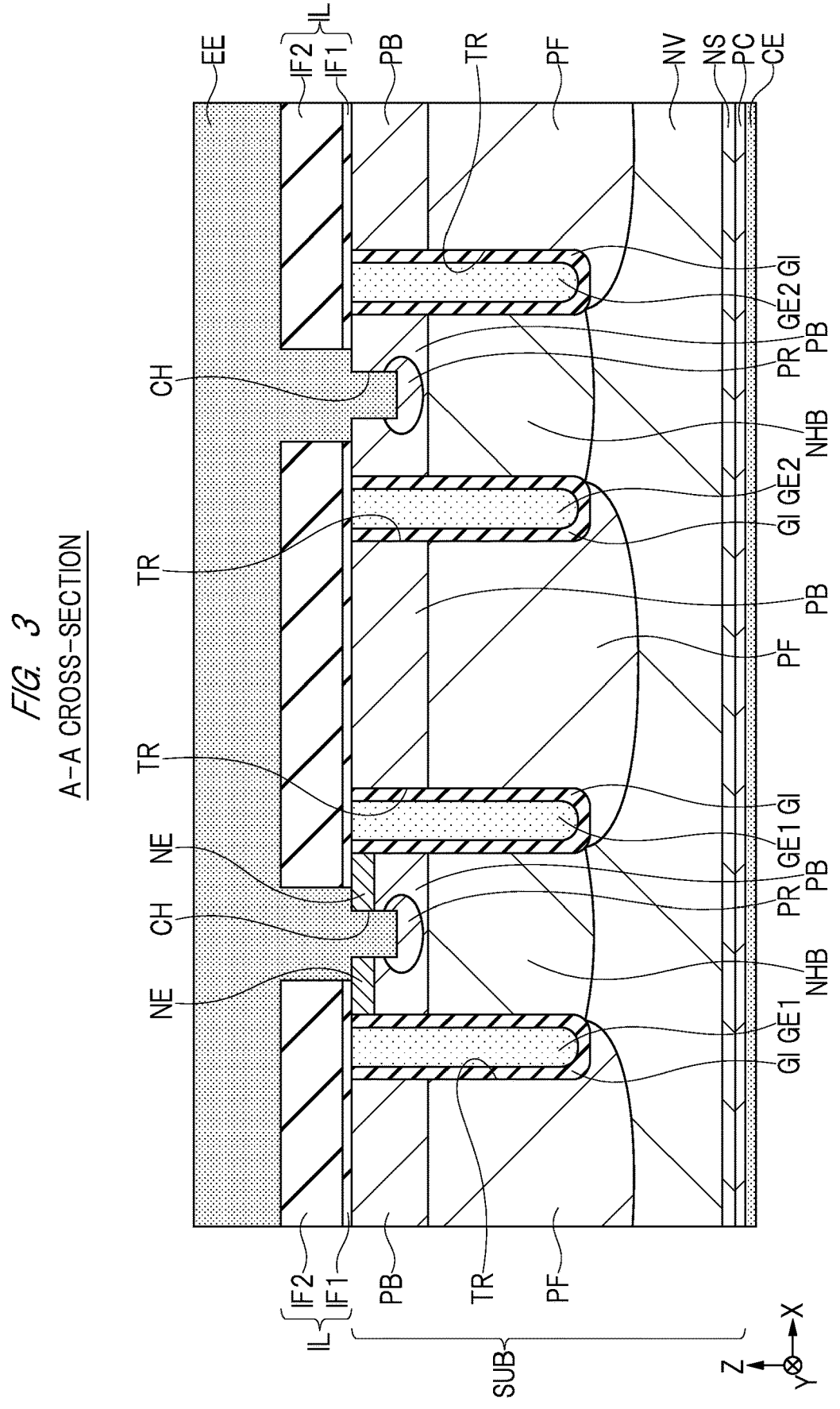
FIG. 3 is a cross-sectional view showing the semiconductor device according to the first embodiment.

FIG. 3 is a cross-sectional view taken along a line A-A shown in FIG. 2. The semiconductor device 100 includes a semiconductor substrate SUB having an n-type drift region NV having low concentration. Here, the n-type semiconductor substrate SUB itself constitutes the drift region NV. Note that the drift region NV may be a layered body having an n-type silicon substrate, and a semiconductor layer grown by the epitaxial growth by being doped with phosphorus (P) on the silicon substrate. In this application, such a layered body will also be described as the semiconductor substrate SUB.

On a back surface side of the semiconductor substrate SUB, the semiconductor substrate SUB has an n-type field stop region (impurity region) NS formed therein. The field stop region NS is provided to prevent a depletion layer extending from a pn junction on a front surface side of the semiconductor substrate SUB from reaching a p-type collector region PC at a time of turning off the IGBT.

On the back surface side of the semiconductor substrate SUB, the semiconductor substrate SUB has the p-type collector region (impurity region) PC formed therein. The collector region PC is positioned below the field stop region NS.

Below the back surface of the semiconductor substrate SUB, a collector electrode CE is formed. The collector electrode CE is electrically connected to the collector region PC to supply the collector region PC with a collector potential. The collector electrode CE is formed of a metal film including, for example, an AlSi film, a Ti film, an NiV film, and an Au film.

On the front surface side of the semiconductor substrate SUB, the semiconductor substrate SUB has trenches TR formed therein. The trench TR penetrates an emitter region NE and a base region PB described later, and reaches the semiconductor substrate SUB. A depth of the trench TR is, for example, 2 μm or more and 3 μm or less.

In the trench TR, a gate insulating film GI is formed. The gate electrodes GE1 and GE2 are formed on the gate insulating films GI so as to bury the interior of the trenches TR. The gate insulating film GI is, for example, a silicon oxide film, and the gate electrodes GE1 and GE2 are, for example, polycrystalline silicon films doped with n-type impurities. A thickness of the gate insulating film GI is, for example, 100 nm.

In the active cell AC, in the semiconductor substrate SUB between a pair of trenches TR (a pair of gate electrodes GE1), a hole barrier region (impurity region) NHB is formed. The hole barrier region NHB has the p-type base region (impurity region) PB formed therein. The p-type base region PB has the n-type emitter region (impurity region)

NE formed therein. A bottom portion of the base region PB is shallower than a bottom portion of the trench TR, and a bottom portion of the emitter region NE is shallower than the bottom portion of the base region PB.

In the inactive cell IAC, in the semiconductor substrate SUB between a pair of trenches TR (a pair of gate electrodes GE2), a hole barrier region NHB is formed. In addition, in the semiconductor substrate SUB between the gate electrode GE1 and the gate electrode GE2, a p-type floating region (impurity region) PF is formed. In the hole barrier region NHB and the floating region PF, the p-type base region PB is formed. Preferably, the floating region PF may be formed to a position deeper than the bottom portion of the trench TR in order to increase a withstand voltage feature, and more preferably, may be formed so as to cover the bottom portion of the trench TR.

On the semiconductor substrate SUB, an interlayer insulating film IL is formed. The interlayer insulating film IL includes an insulating film IF1 formed on the semiconductor substrate SUB, and an insulating film IF2 formed on the insulating film IF1. The insulating film IF1 is a silicon oxide film. The insulating film IF2 is a silicon oxide film containing boron and phosphorus, which is a BPSG (Boro Phospho Silicate Glass) film. A thickness of the insulating film IF1 is, for example, 20 nm or more and 50 nm or less.

In the active cell AC, a contact hole CH penetrates the interlayer insulating film IL and the emitter region NE, and reaches the base region PB. The contact hole CH is formed in contact with the emitter region NE and the base region PB.

On an upper side of the contact hole CH, the interlayer insulating film IL is recessed. Accordingly, part of an upper surface of the emitter region NE is exposed from the interlayer insulating film IL. Hence, the emitter electrode EE is in contact with not only a side surface of the emitter region NE in the contact hole CH, but also the part of the upper surface of the emitter region NE. This makes it possible to reduce a contact resistance between the emitter electrode EE and the emitter region NE.

A configuration of the contact hole CH in the inactive cell IAC is also substantially similar to that in the active cell AC, except for presence of the emitter region NE. In each of the active cell AC and the inactive cell IAC, around a bottom portion of the contact hole CH, a p-type high concentration diffusion region (impurity region) PR is formed. The high concentration diffusion region PR is provided so as to reduce a contact resistance to the emitter electrode EE and prevent latch-up.

Note that, although no illustration is provided here, the contact hole CH is formed also on part of each of the gate electrodes GE1 and GE2.

The emitter electrode EE is formed on the interlayer insulating film IL so as to bury the interior of the contact hole CH. The emitter electrode EE is electrically connected to the emitter region NE, the base region PB, the high concentration diffusion region PR, and the gate electrode GE2, supplying an emitter potential to these regions.

Note that, although no illustration is provided here, the gate wiring GW formed in the same process as that of the emitter electrode EE is also formed on the interlayer insulating film IL. The gate wiring GW is buried in the contact hole CH on the gate electrode GE1, and is electrically connected to the gate electrode GE1, supplying a gate potential to the gate electrode GE1. Such emitter electrode EE and gate wiring GW are formed of, for example, a TiW film, and an aluminum film formed on the above-mentioned TiW film. The above-mentioned aluminum film is a main conductive film of the emitter electrode EE and the gate wiring GW, and sufficiently thicker than the above-mentioned TiW film.

In addition, the emitter electrode EE and the gate wiring GW may each include the above-mentioned TiW film and the above-mentioned aluminum film and may each include a wiring portion formed on the interlayer insulating film IL and a plug formed in the contact hole CH. In this case, the above-mentioned plug includes a layered film having a barrier metal film and a conductive film. The above-mentioned barrier metal film is formed of, for example, a layered film including a titanium film and a titanium nitride film formed on the above-mentioned titanium film. The above-mentioned conductive film is formed of, for example, a tungsten film.

An impurity concentration of each impurity region will be provided below as an example. The drift region NV has an impurity concentration of $1\times10^{13}$ cm$^{-3}$ or more and $2\times10^{14}$ cm$^{-3}$ or less. The field stop region NS has an impurity concentration of $5\times10^{16}$ cm$^{-3}$ or more and $5\times10^{17}$ cm$^{-3}$ or less, which is higher than the impurity concentration of the drift region NV. The hole barrier region NHB has an impurity concentration of $1\times10^{16}$ cm$^{-3}$ or more and $1\times10^{17}$ cm$^{-3}$ or less, which is higher than the impurity concentration of the drift region NV. The emitter region NE has an impurity concentration of $1\times10^{18}$ cm$^{-3}$ or more and $1\times10^{21}$ cm$^{-3}$ or less, which is higher than the impurity concentration of the hole barrier region NHB. The collector region PC has an impurity concentration of $1\times10^{17}$ cm$^{-3}$ or more and $1\times10^{21}$ cm$^{-3}$ or less. The floating region PF has an impurity concentration of $1\times10^{15}$ cm$^{-3}$ or more and $1\times10^{16}$ cm$^{-3}$ or less. The base region PB has an impurity concentration of $1\times10^{16}$ cm$^{-3}$ or more and $1\times10^{18}$ cm$^{-3}$ or less, which is higher than the impurity concentration of the floating region PF. The high concentration diffusion region PR has an impurity concentration of $1\times10^{18}$ cm$^{-3}$ or more and $1\times10^{21}$ cm$^{-3}$ or less, which is higher than the impurity concentration of the base region PB.

Method of Manufacturing Semiconductor Device

With reference to FIG. 4 to FIG. 9, a method of manufacturing the semiconductor device 100 according to the first embodiment will be described below.

Figure 4:
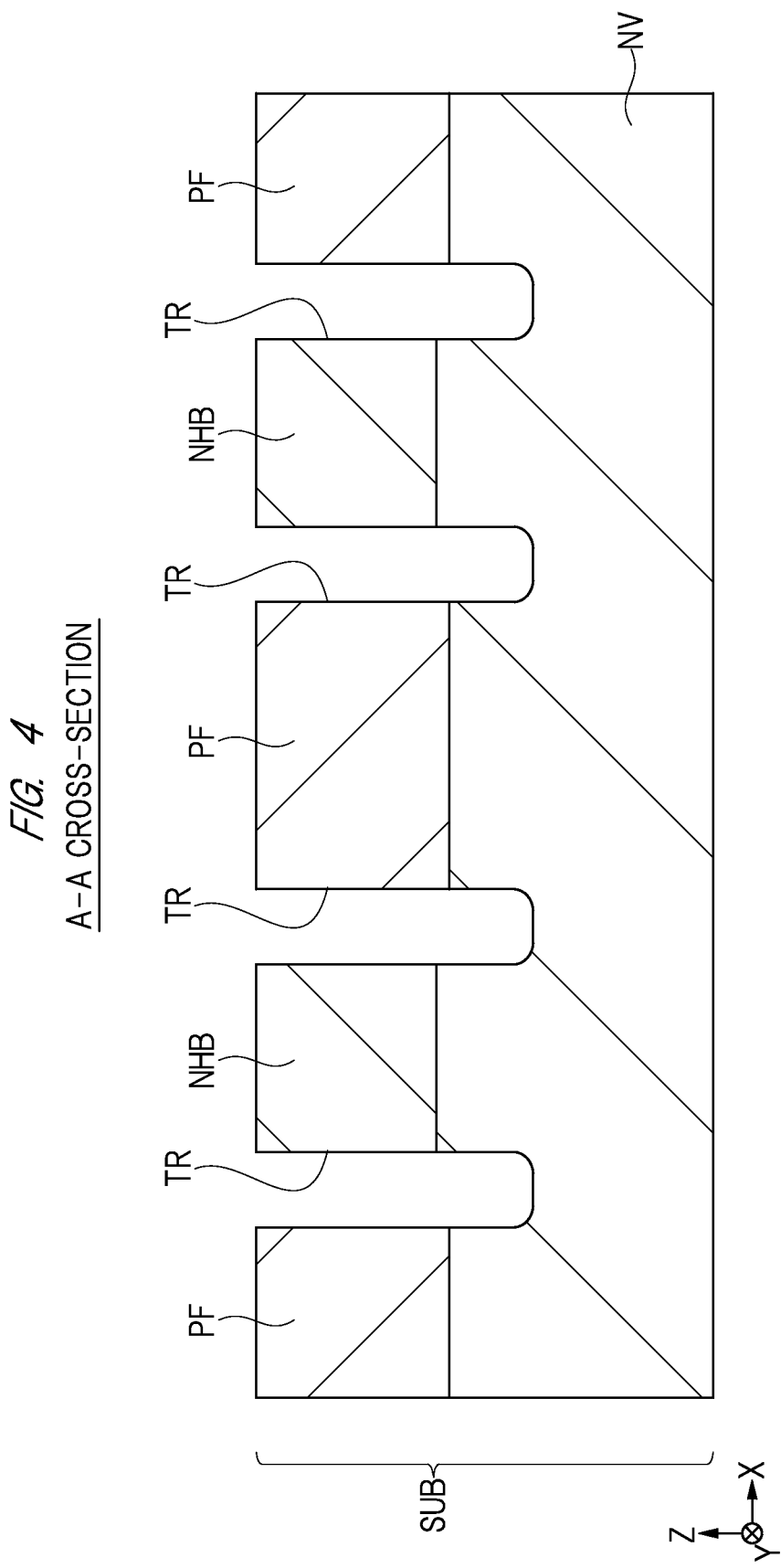
FIG. 4 is a cross-sectional view showing a manufacturing process of the semiconductor device according to the first embodiment.

As shown in FIG. 4, first, a semiconductor substrate SUB having an n-type drift region NV is prepared. Next, an n-type hole barrier region NHB and a p-type floating region PF are formed in the semiconductor substrate SUB by photolithography and ion implantation.

Subsequently, trenches TR are formed in the semiconductor substrate SUB. First, on the semiconductor substrate SUB, for example, an insulating film including a silicon oxide film is formed, and by photolithography and dry etching, the above-mentioned insulating film is patterned to form a hard mask. Then, with the above-mentioned hard mask as a mask, the semiconductor substrate SUB is subjected to anisotropic etching, and consequently, trenches TR are formed in the semiconductor substrate SUB. Thereafter, by wet etching or the like, the above-mentioned hard mask is removed.

Figure 5:
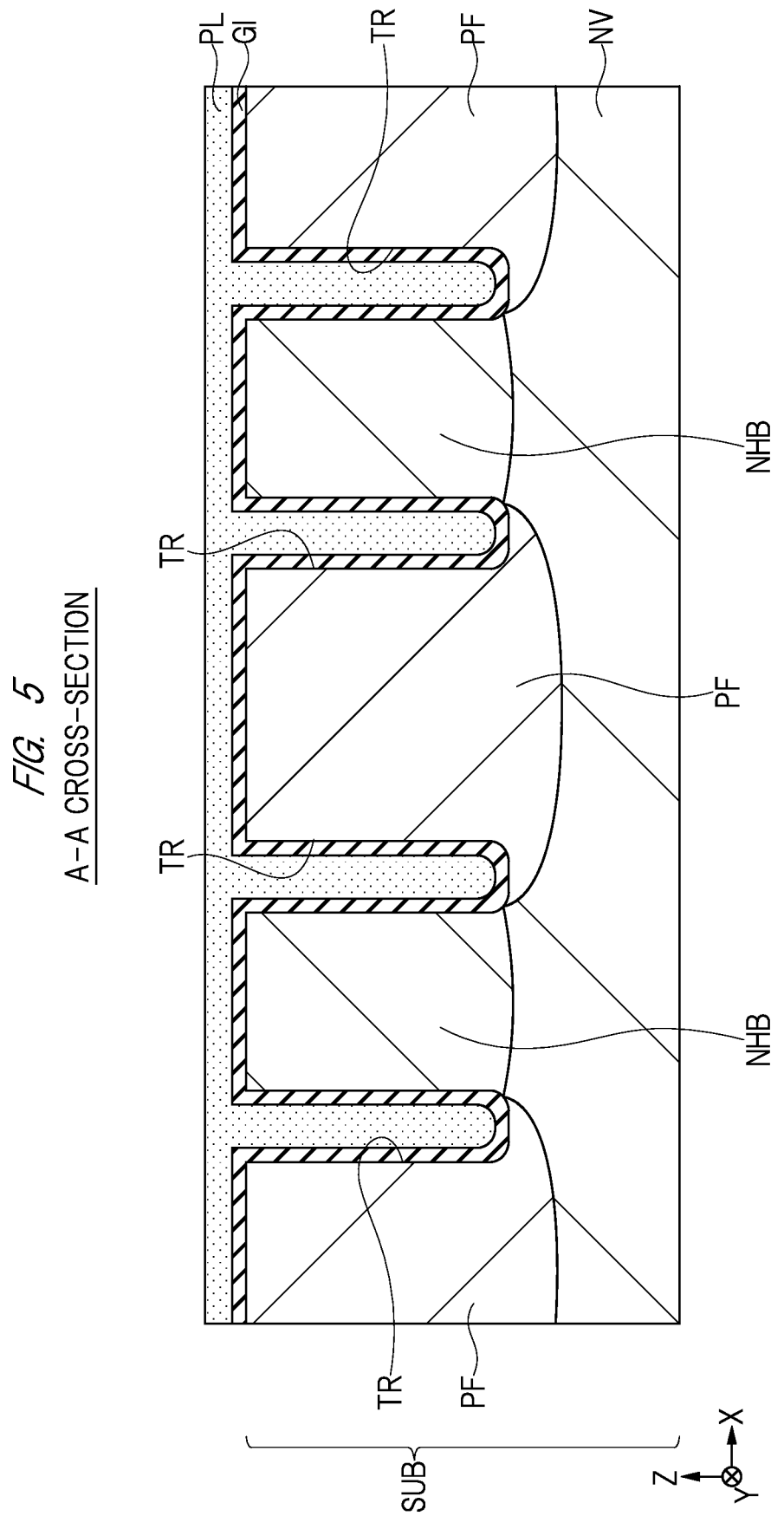
FIG. 5 is a cross-sectional view showing the manufacturing process continued from FIG. 4.

As shown in FIG. 5, first, the semiconductor substrate SUB is subjected to, for example, a heat treatment at 1000° C. or more and 1200° C. or less, to thereby diffuse impurities included in the hole barrier region NHB and the floating region PF. According to this heat treatment, the diffusion of the hole barrier region NHB extends in the vicinity of the bottom portion of the trench TR, and the diffusion of the floating region PF extends to a position deeper than the bottom portion of the trench TR so as to cover the bottom portion of the trench TR.

Subsequently, a gate insulating film GI is formed in the trench TR and on the semiconductor substrate SUB. Formation of the gate insulating film GI is carried out in the atmosphere at 950° C., by a thermal oxidation treatment (wet oxidation treatment) with use of water vapor. A thickness of the gate insulating film GI is, for example, 100 nm. Then, in such a manner as to bury the interior of the trench TR, for example, by the CVD, a conductive film PL, such as a polycrystalline silicon film, doped with n-type impurities is formed on the gate insulating film GI.

Figure 6:
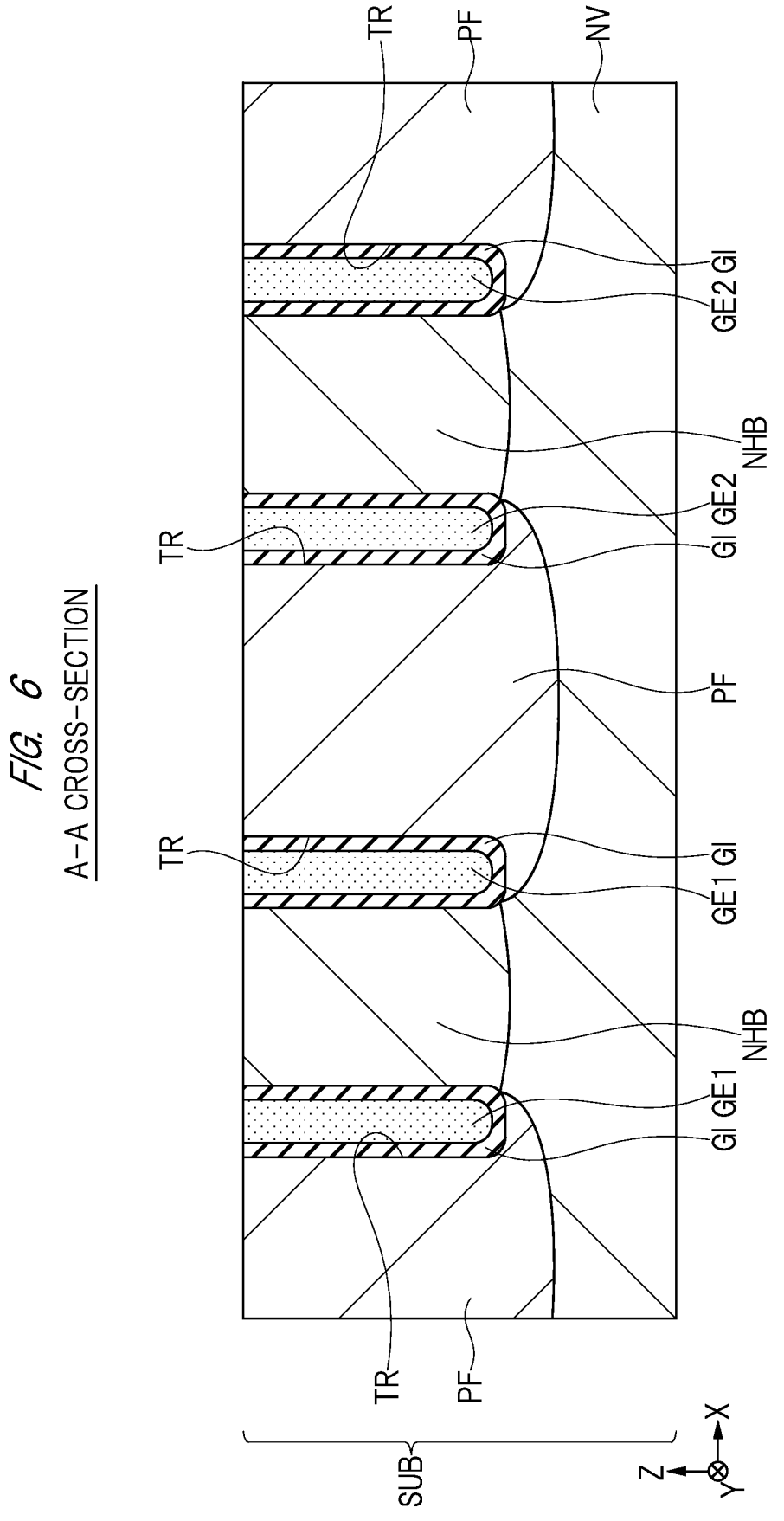
FIG. 6 is a cross-sectional view showing the manufacturing process continued from FIG. 5.

As shown in FIG. 6, first, by dry etching, the conductive film PL formed outside the trench TR is removed. The conductive film PL formed in the trenches TR remains as the gate electrodes GE1 and GE2. Then, by anisotropic etching and isotropic etching, the gate insulating film GI formed outside the trench TR is removed.

Figure 7:
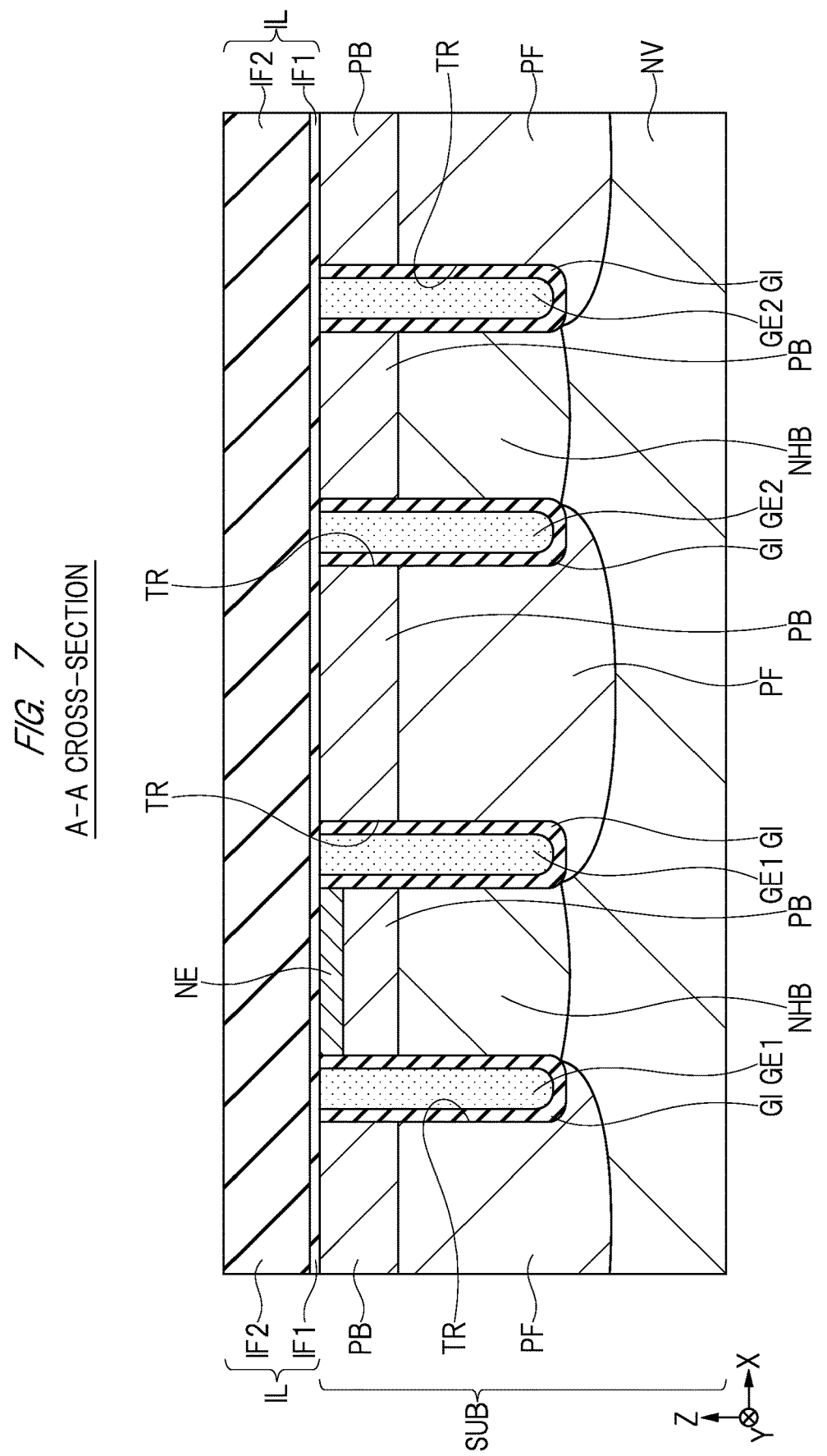
FIG. 7 is a cross-sectional view showing the manufacturing process continued from FIG. 6.

As shown in FIG. 7, on the semiconductor substrate SUB, the insulating film IF1 including a silicon oxide film is formed. Formation of the insulating film IF1 is carried out by a thermal oxidation treatment (dry oxidation treatment) with use of oxygen gas, in the atmosphere at 950° C. A thickness of the insulating film IF1 is, for example, 20 nm or more and 50 nm or less.

Subsequently, with the insulating film IF1 as a through film, by photolithography and ion implantation, a p-type base region PB is formed in the semiconductor substrate SUB (floating region PF and the hole barrier region NHB). Then, by photolithography and ion implantation, an n-type emitter region NE is formed in the base region PB of the active cell AC.

Then, for example, by the CVD, an insulating film IF2 is formed on the insulating film IF1. The insulating film IF2 is a silicon oxide film containing boron and phosphorus and is a BPSG film. Each of the insulating film IF1 and the insulating film IF2 constitutes part of the interlayer insulating film IL. A thickness of the insulating film IF2 is larger than a thickness of the insulating film IF1 and is, for example, 1000 nm. Subsequently, for example, the insulating film IF2 is subjected to a heat treatment (reflow process) at 950° C. for 30 seconds, for example. Owing to this reflow process, the insulating film IF2 is softened, so that an upper surface of the insulating film IF2 is planarized.

Figure 8:
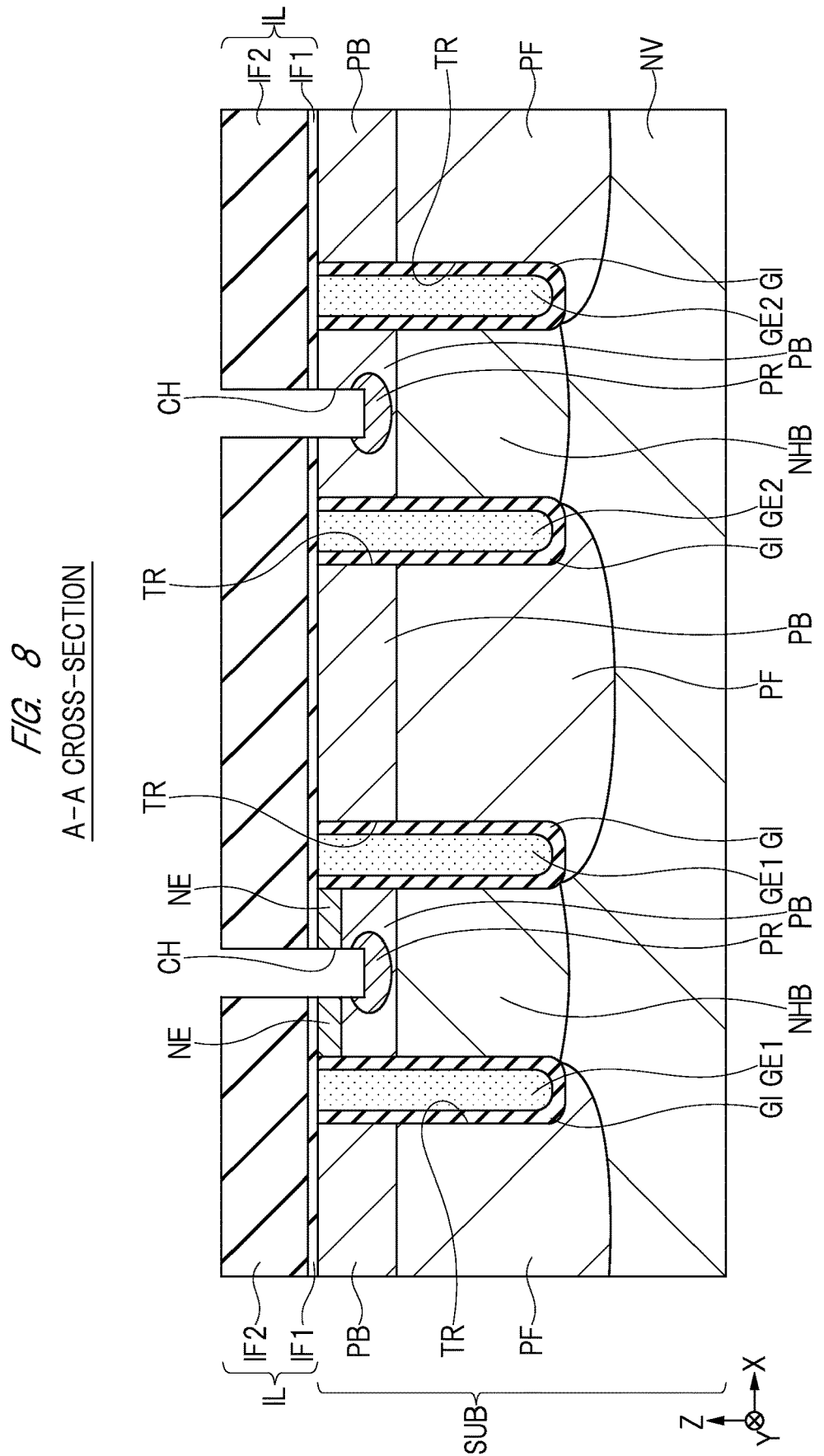
FIG. 8 is a cross-sectional view showing the manufacturing process continued from FIG. 7.

As shown in FIG. 8, by photolithography and dry etching, a contact hole CH is formed in the insulating film IF2, the insulating film IF1, the emitter region NE, and the base region PB. The bottom portion of the contact hole CH is positioned in the base region PB.

Next, by photolithography and ion implantation, a p-type high concentration diffusion region PR is formed at the bottom portion of the contact hole CH. Thereafter, for example, a heat treatment is carried out at 950° C. for 30 seconds, activating impurities included in each of the impurity regions.

Figure 9:
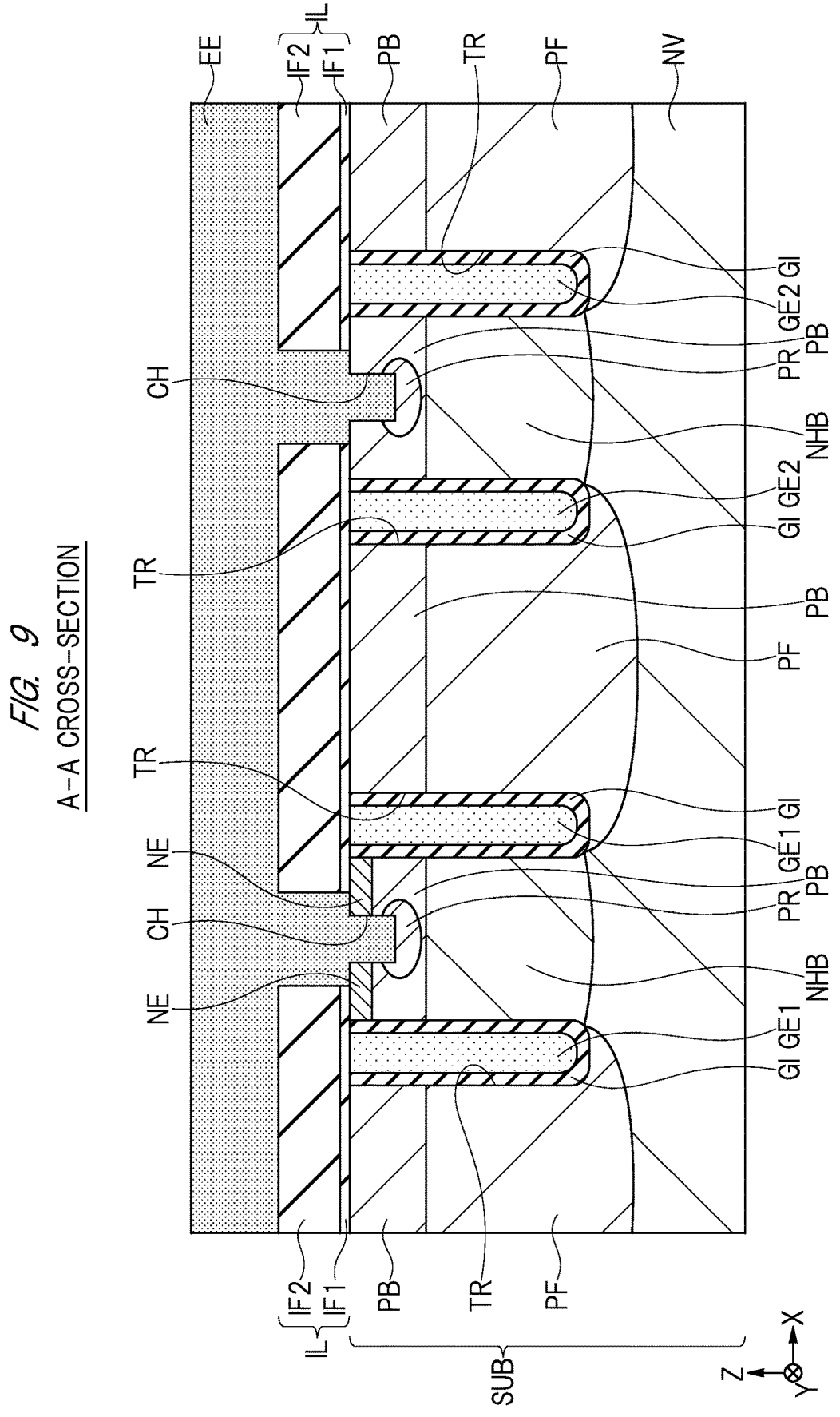
FIG. 9 is a cross-sectional view showing the manufacturing process continued from FIG. 8.

As shown in FIG. 9, the insulating film IF2 and the insulating film IF1 are subjected to isotropic etching, thereby causing the insulating film IF2 and the insulating film IF1 to be recessed. In this isotropic etching, aqueous solution containing hydrofluoric acid is used, for example. As a result, an opening width of the contact hole CH positioned on the semiconductor substrate SUB is larger than an opening width of the contact hole CH positioned in the semiconductor substrate SUB. Note that a recess amount of the insulating film IF2 and the insulating film IF1 resulting from isotropic etching is substantially 130 nm.

Next, in such a manner as to bury the interior of the contact hole CH, an emitter electrode EE is formed on the interlayer insulating film IL. First, for example, by sputtering, a TiW film is formed on the interlayer insulating film IL, and, for example, an aluminum film is formed on the above-mentioned TiW film by sputtering. Next, by photolithography and dry etching, the above-mentioned TiW film and the above-mentioned aluminum film are patterned to form the emitter electrode EE. Note that, although illustration is not provided here, a gate wiring GW is also formed in the same process as that of forming the emitter electrode EE.

In addition, after formation of the above-mentioned TiW film is carried out by the above-mentioned sputtering, in order to form a metal alloy, a hydrogen anneal treatment is carried out. The hydrogen anneal treatment is carried out in the atmosphere of hydrogen at 400° C. or more and 600° C. or less for 30 minutes, for example.

Thereafter, through the following manufacturing process, the structure shown in FIG. 3 is obtained. First, ion implantation is carried out from the back surface side of the semiconductor substrate SUB, so that an n-type field stop region NS and a p-type collector region PC are formed. After the ion implantation is carried out, laser annealing is carried out on these regions, activating impurities included in the field stop region NS and the collector region PC. Then, on the collector region PC exposed on the back surface side of the semiconductor substrate SUB, a metal film such as an AlSi film, a Ti film, an NiV film, and an Au film is formed by sputtering, for example. This metal film serves as the collector electrode CE.

Study by Inventors of Present Application

As described above, the thickness of the gate insulating film GI is relatively large, and accordingly, at times of formation of the gate insulating film GI and dry etching of the conductive film PL, the gate insulating film GI tends to vary in thickness. Hence, in the first embodiment, the insulating film IF1 having a uniform and small thickness is formed again, and the insulating film IF1 is used as a through film for the ion implantation.

In addition, the gate insulating film GI is formed by the wet oxidation treatment, and the insulating film IF1 is formed by the dry oxidation treatment. In the wet oxidation treatment, a solubility of water vapor is large, and a diffusion rate of $H_2O$ molecule is large. As a result, an oxidation rate in the wet oxidation treatment is faster than that in the dry oxidation treatment. In the dry oxidation treatment, the oxidation rate is slow. However, use of the dry oxidation treatment is suitable for formation of the insulating film IF1 in that a film having a uniform thickness is formed.

Figure 10:
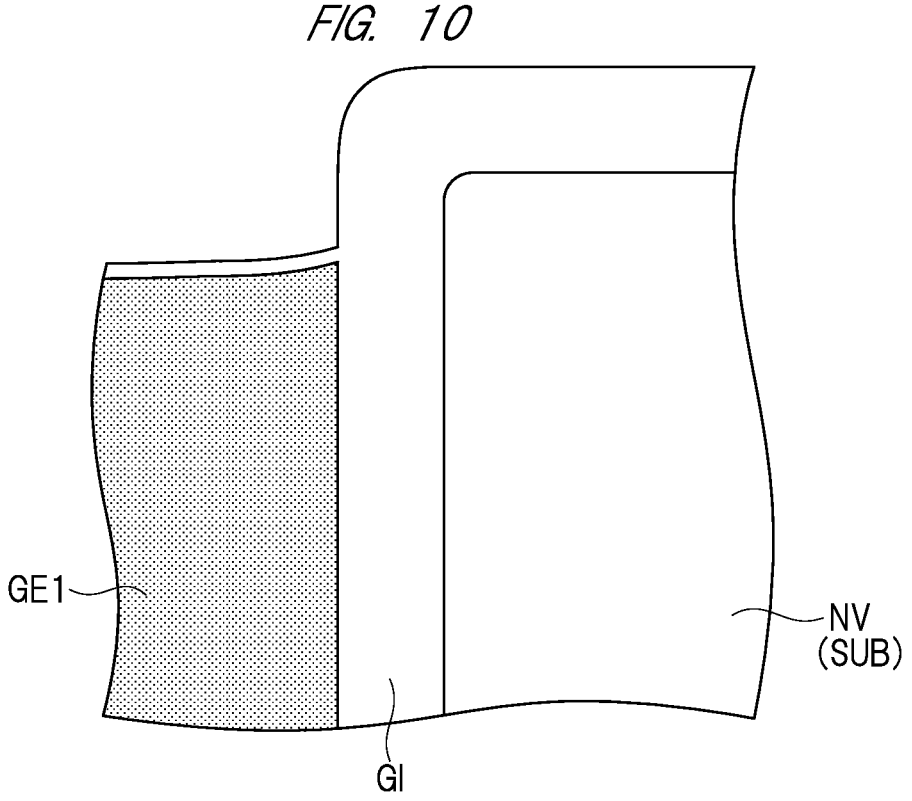
FIG. 10 is an enlarged cross-sectional view showing the details of the manufacturing process in FIG. 6.

With reference to FIG. 10 to FIG. 15, a manufacturing process in FIG. 6 and subsequent figures will be described below in details. FIG. 10 shows a state in which, after gate insulating film GI and the conductive film PL are formed, the conductive film PL formed outside the trench TR is removed, and the gate electrode GE1 is formed.

Here, as shown in FIG. 10, in order to recover damage resulting from etching to the upper surface of the gate electrode GE1, the thermal oxidation treatment (dry oxidation treatment) is carried out in an atmosphere at 950° C., with use of oxygen gas, and thus, a thin silicon oxide film may be formed on the upper surface of the gate electrode GE1. In FIG. 10, such a silicon oxide film is shown in a manner being integrated with the gate insulating film GI.

Note that the periphery of the gate electrode GE1 is described here. However, also in the periphery of the gate electrode GE2, the manufacturing process similar to that of the gate electrode GE1 is carried out, except for formation of the emitter region NE.

Figure 11:
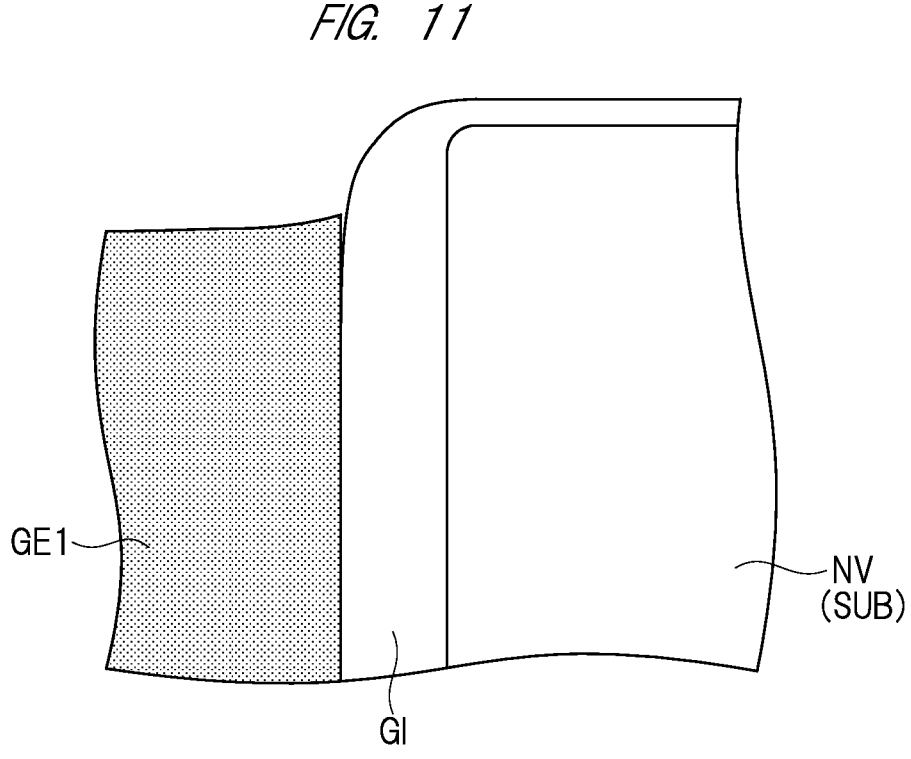
FIG. 11 is an enlarged cross-sectional view showing the manufacturing process continued from FIG. 10.

As shown in FIG. 11, the gate insulating film GI is subjected to anisotropic etching to make the thickness of the gate insulating film GI small. In this case, when an attempt to entirely remove the gate insulating film GI on the semiconductor substrate SUB by anisotropic etching is made, at a time of overetching, undesirable damage resulting from etching is caused in the semiconductor substrate SUB. To prevent this possible damage, the most part of the gate insulating film GI is removed by anisotropic etching, and the gate insulating film GI is partially left outside the trench TR.

Figure 12:
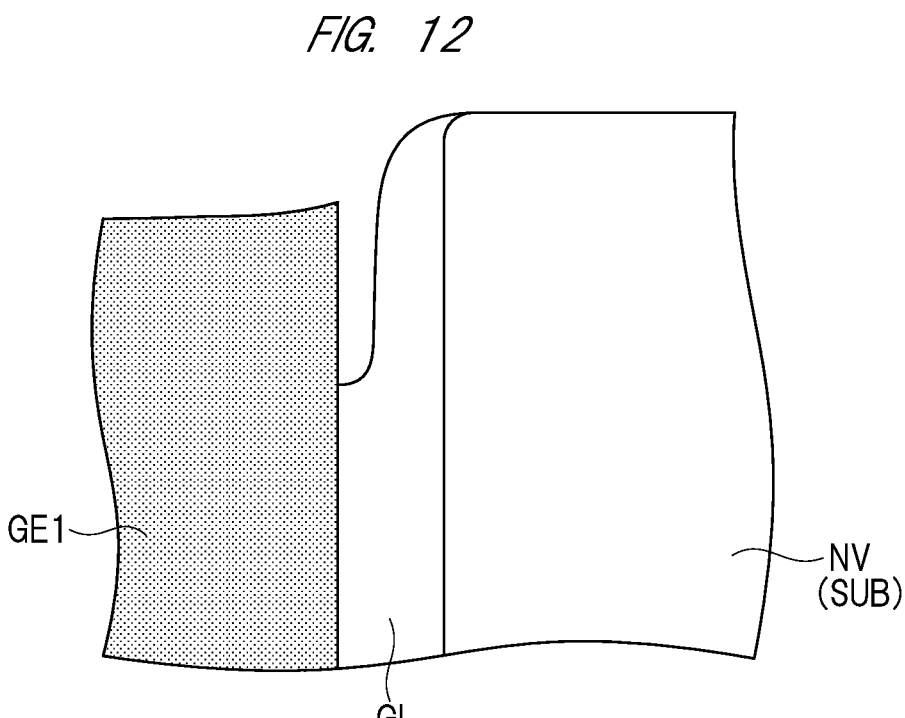
FIG. 12 is an enlarged cross-sectional view showing the manufacturing process continued from FIG. 11.

As shown in FIG. 12, the gate insulating film GI is subjected to isotropic etching to remove the gate insulating film GI formed outside the trench TR. In this instance, etching proceeds also from the upper surface side of the gate electrode GE1, and accordingly, a portion of the gate insulating film GI in contact with a side surface of the gate electrode GE1 in the trench TR is also removed. As a result, a corresponding portion of the side surface of the gate electrode GE1 is exposed. That is, the upper surface of the gate electrode GE1 is exposed.

Figure 13:
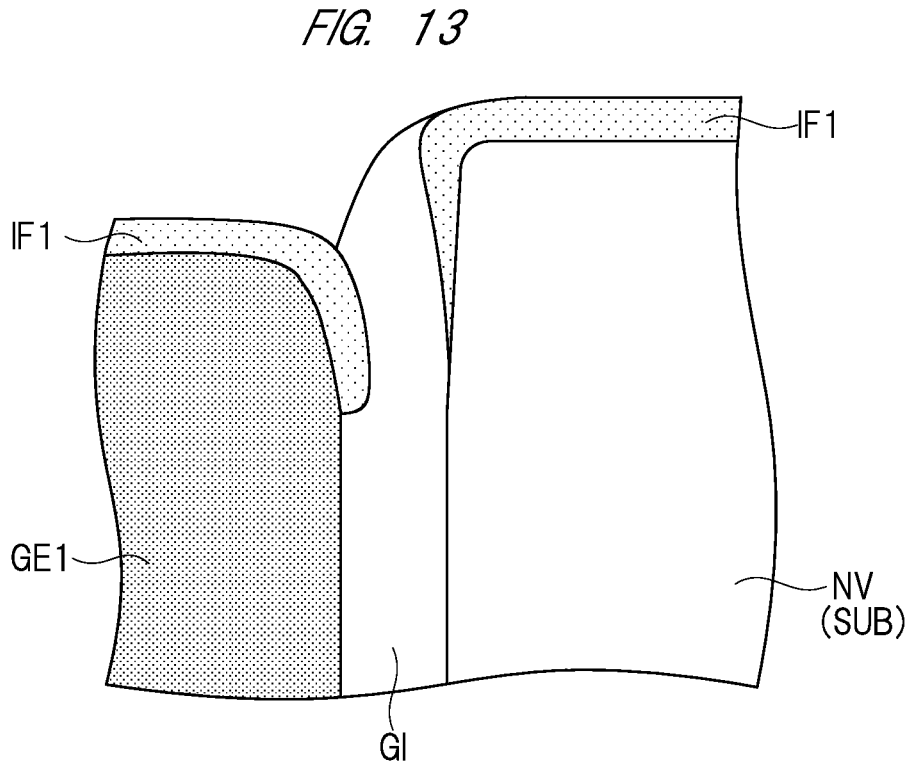
FIG. 13 is an enlarged cross-sectional view showing the manufacturing process continued from FIG. 12.

As shown in FIG. 13, the insulating film IF1 including a silicon oxide film is formed on the semiconductor substrate SUB. Formation of the insulating film IF1 is carried out by the thermal oxidation treatment (dry oxidation treatment) in the atmosphere at 950° C., with use of oxygen gas. In addition, a thickness of the insulating film IF1 formed on the semiconductor substrate SUB is smaller than a thickness of the gate insulating film GI formed on the semiconductor substrate SUB in FIG. 5 and is equal to or smaller than half the thickness of the gate insulating film GI, for example, being 20 nm or more and 50 nm or less.

According to the above-mentioned dry oxidation treatment, the insulating film IF1 is formed between the side surface of the trench TR and the gate insulating film GI, like a bird's beak. In addition, the insulating film IF is formed also on the exposed portion of the side surface of the gate electrode GE1. Specifically, the upper part of the gate electrode GE1 is oxidized, and a corner portion formed by the upper surface of the gate electrode GE1 and the side surface of the gate electrode GE1 is oxidized. Note that the gate insulating film GI and the insulating film IF1 are integrated with each other. However, for promoting understanding of the description, they are illustrated separately here.

Figure 14:
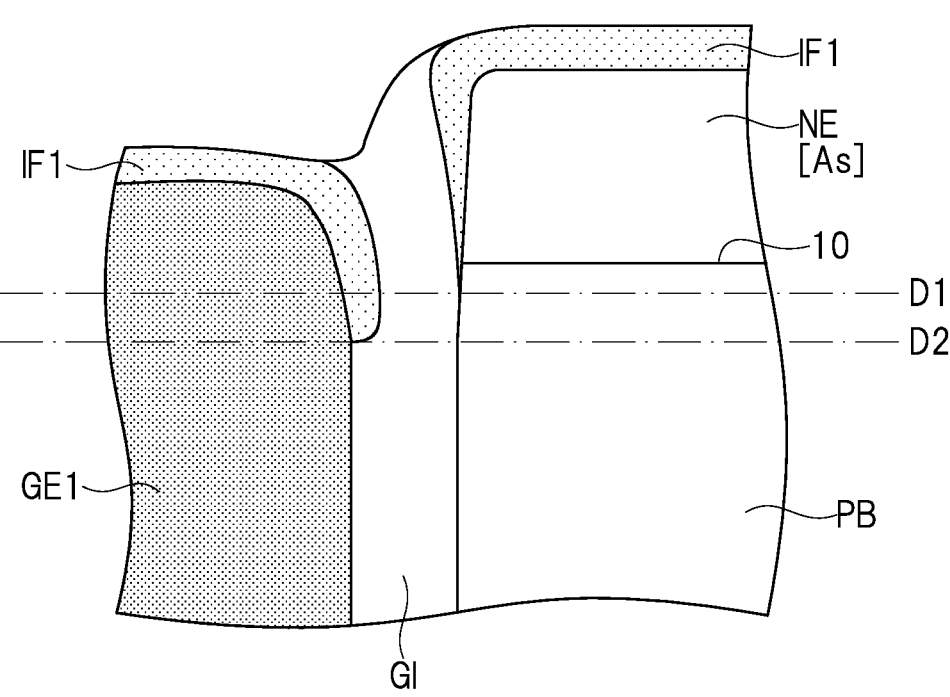
FIG. 14 is an enlarged cross-sectional view showing the manufacturing process continued from FIG. 13 and depth relations among components.

Next, as shown in FIG. 14, by photolithography and ion implantation, the base region PB is formed in the semiconductor substrate SUB, and the emitter region NE is formed in the base region PB. These ion implantations are carried out, with the insulating film IF1 used as the through film. The ion implantation for the base region PB is carried out with use of boron under a condition in which an energy is set at 110 keV and the dose amount is set to be $1 \times 10^{13}$ $cm^2$ or more and $2 \times 10^{13}$ $cm^2$ or less. The ion implantation for the emitter region NE is carried out with use of arsenic under a condition in which an energy is set at 100 keV and the dose amount is set to be $1 \times 10^{15}$ $cm^2$ or more and $5 \times 10^{15}$ $cm^2$ or less. In the first embodiment, a boundary 10 between the base region PB and the emitter region NE is, for example, positioned at 100 nm or more and 200 nm or less from the upper surface of the semiconductor substrate SUB.

Figure 15:
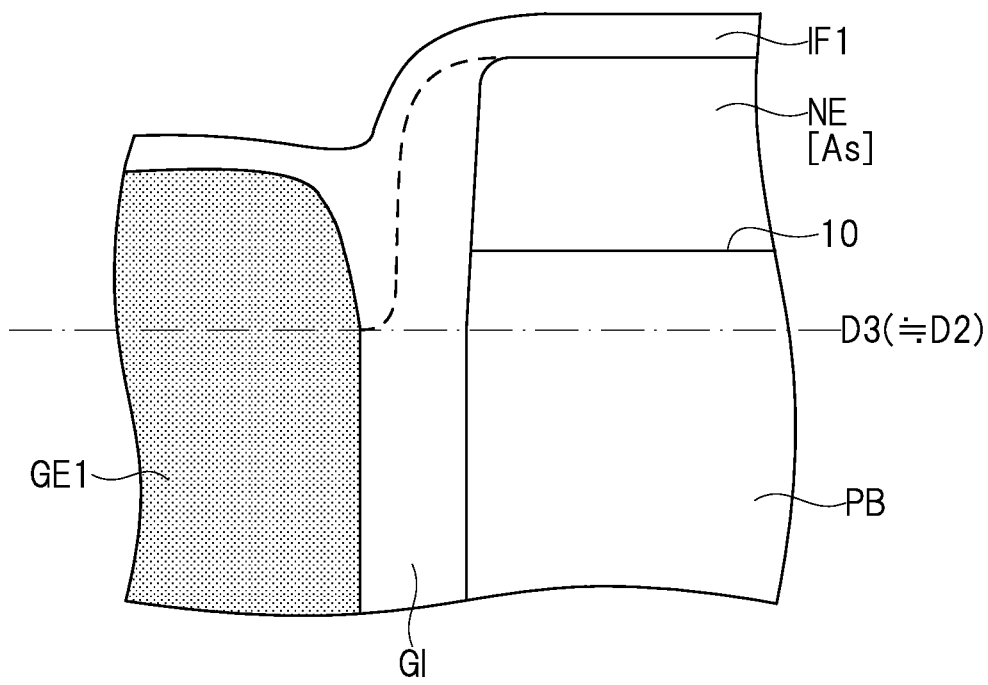
FIG. 15 is an enlarged cross-sectional view showing the depth relations among the components.

A reference sign D1 indicates a depth position of the insulating film IF1 formed between the side surface of the trench TR and the gate insulating film GI. A reference sign D2 indicates a depth position of the insulating film IF1 formed on the portion of the side surface of the gate electrode GE1. The boundary 10 is positioned at a position shallower than these depth positions D1 and D2 of the insulating film IF1. In addition, as shown in FIG. 15, the boundary 10 is positioned at a position shallower than the exposed portion of the side surface of the gate electrode GE1 (depth D3) in FIG. 12. Note that the depth D3 is substantially same as the depth D2.

According to the study by the inventors of the present application, it was found out that, when the dry oxidation treatment is carried out, the interface state increases, and hydrogen ions are formed, resulting in degradation of PBTI. Originally, the interface state is a state in which an SiH junction present at an interface is disconnected. The wet oxidation treatment is carried out in an atmosphere of $H_2O$, and accordingly, the interface state becomes a state in which rejoining of hydrogen ions in $H_2O$ is made and the SiH junction is likely to be regenerated. Hence, the wet oxidation treatment is assumed to be likely to reduce the interface state. In contrast, the dry oxidation treatment is carried out in an atmosphere of oxygen gas, and accordingly, the SiH junction is hardly regenerated. Hence, the dry oxidation treatment is assumed to hardly reduce the interface state.

Figures 16, 17:
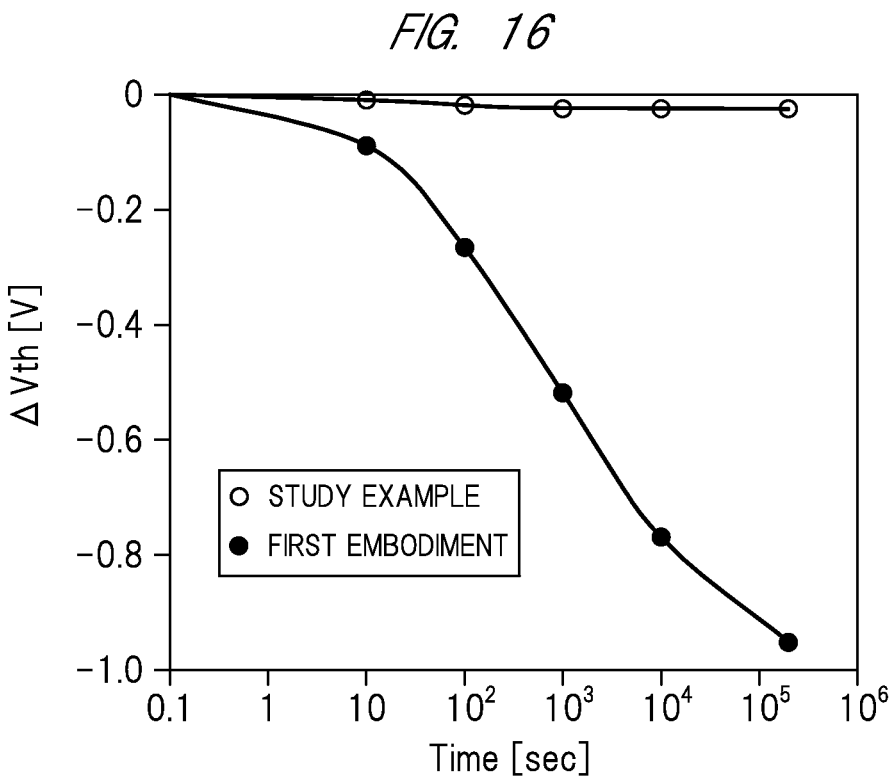
FIG. 16 is a graph showing a result obtained by analyzing degradation of PBTI.
FIG. 17 is an enlarged cross-sectional view showing a model of degradation of PBTI.

FIG. 16 is a graph showing a result obtained by analyzing degradation of PBTI by the inventors of the present application. FIG. 17 is an enlarged cross-sectional view showing a model of degradation of PBTI according to the first embodiment.

In FIG. 16, the study example (white circle) and the first embodiment (black circle) are shown. In the study example (white circle), removal of the gate insulating film GI and formation of the insulating film IF1 by the dry oxidation treatment are not carried out, and the gate insulating film GI is used as a through film for the ion implantation. In the first embodiment (black circle), due to degradation of PBTI, as time passes, the threshold voltage (Vth) fluctuates. The inventors of the present application found out, with use of a component separation method, that degradation of PBTI is caused by interface state components and trap components by hydrogen ions in the gate insulating film. The hydrogen ions which are diffused due to PBTI stress terminate the interface state, and the threshold voltage decreases. Meanwhile, when the hydrogen ions as positive charges come closer to an interface between the gate insulating film GI and the base region PB, the hydrogen ions function as traps in the film, and the threshold voltage is assumed to be decreased.

Specifically, as shown in FIG. 17, when a portion where the interface state is present and a portion where the hydrogen ions are distributed are used as channel regions, fluctuation of the threshold voltage (ΔVth) is generated.

Main Feature of First Embodiment

With reference to FIG. 2, and FIG. 18 to FIG. 22, the semiconductor device 100 according to the first embodiment will be described below.

As shown in FIG. 2, the trench TR, the gate electrode GE1, the gate electrode GE2, and the contact hole CH extend in the Y direction. A plurality of emitter regions NE are formed between a pair of the trenches TR (a pair of gate electrodes GE1), and formed to be spaced apart by a distance L1 from each other along the Y direction. The base region PB positioned below the emitter region NE adjacent to the gate electrode GE1 is used as a channel region.

In FIG. 2, a width of each of the plurality of emitter regions NE in the Y direction is shown as a width W1. The width W1 is an effective gate width, and a total value of a plurality of widths W1 serve as the entire gate width in one active cell AC.

Figure 18:
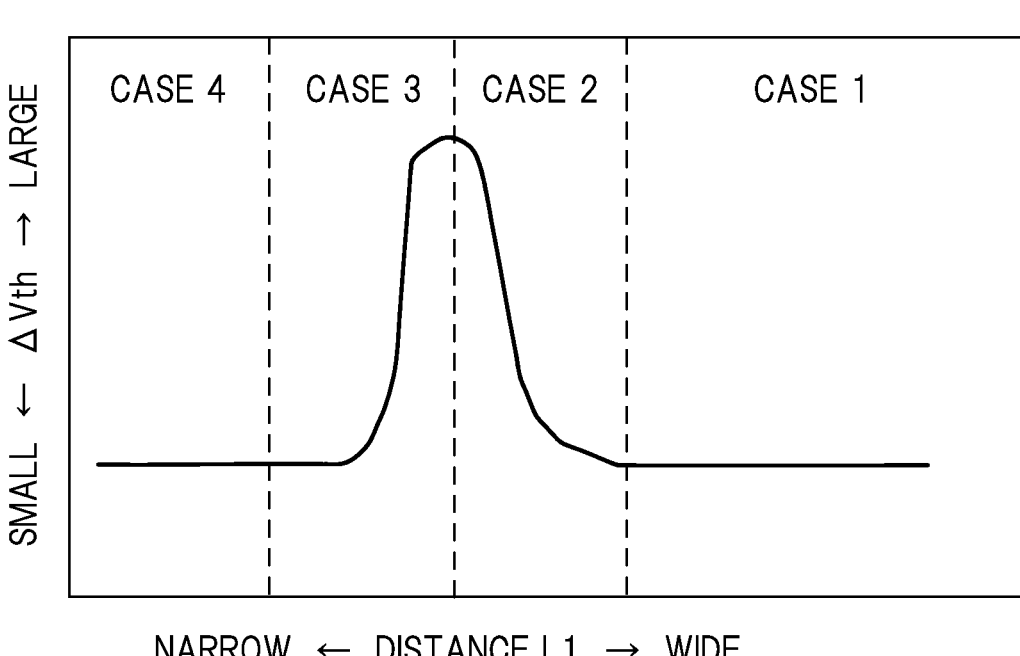
FIG. 18 is a graph showing a result obtained by analyzing a distance between adjacent ones of emitter regions and fluctuation in threshold voltage.

FIG. 18 is a result of an experiment conducted by the inventors of the present application and is a graph showing relations between the fluctuation in threshold voltage (ΔVth) due to the above-mentioned degradation of PBTI and the distance L1. In addition, FIG. 19 to FIG. 22 are cross-sectional views taken along a line B-B shown in FIG. 2 and schematically show cases 1 to 4 shown in FIG. 18, respectively.

Note that, as shown in FIG. 19 to FIG. 22, the emitter region NE includes a high concentration region NEa, and a low concentration region NEb having an impurity concentration lower than that of the high concentration region NEa. The low concentration region NEb is a region in which impurities included in the high concentration region NEa are diffused from the high concentration region NEa as a result of a heat treatment. Note that the low concentration region NEb is not a region having a uniform impurity concentration and is, in practice, a region in which the impurity concentration is lower as the low concentration region NEb is farther from the high concentration region NEa.

Hence, more specifically, the above-mentioned width W1 is a total value of the width W1a of the high concentration region NEa in the Y direction and a two-fold value of the width W1b of the low concentration region NEb diffused from the high concentration region NEa. In addition, the above-mentioned distance L1 is a distance at which adjacent ones of a plurality of low concentration regions NEb are spaced apart from each other in the Y direction.

As shown in FIG. 18, according to the study conducted by the inventors of the present application, it was found out that fluctuation of the threshold voltage changes, depending on a value of the distance L1. For example, in the case 1 and the case 4, fluctuation of the threshold voltage can be kept to the minimum. However, in the case 2 and the case 3, fluctuation of the threshold voltage is greatly large.

Figure 19:
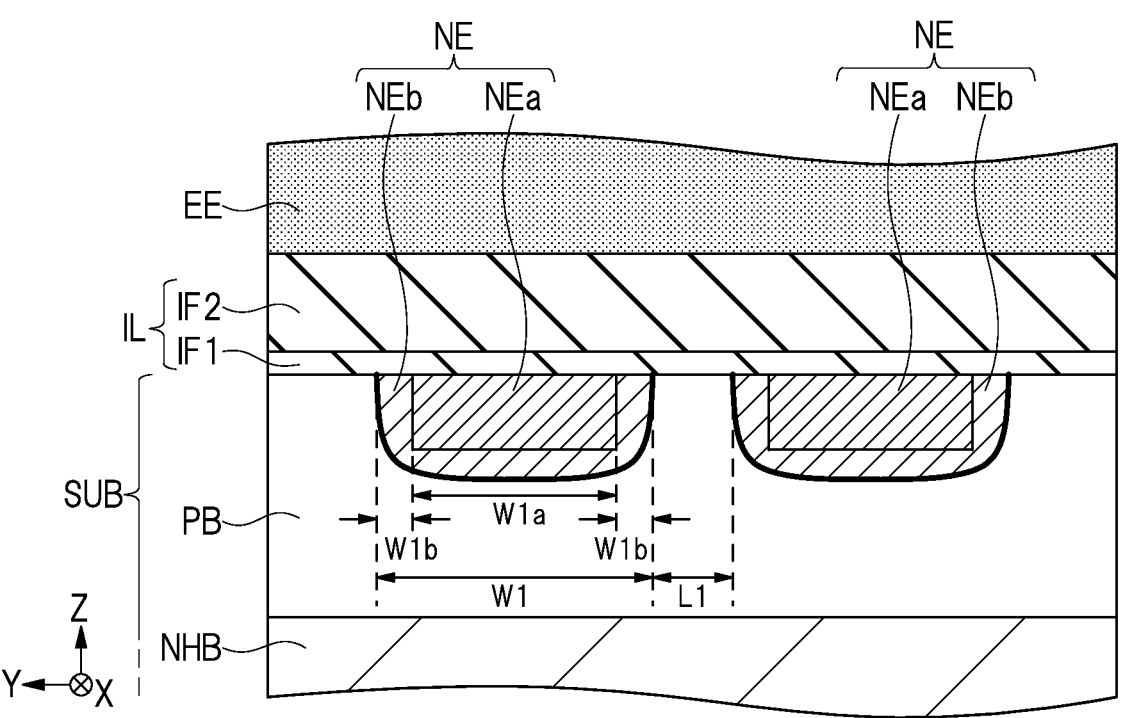
FIG. 19 is a cross-sectional view showing a model of the analysis in FIG. 18.

As shown in FIG. 19, if the distance L1 is sufficiently wide and adjacent ones of the emitter regions NE (low concentration regions NEb) are not in contact with each other, current does not flow in the base region PB positioned between the two adjacent emitter regions NE. Consequently, the fluctuation of the threshold voltage is small.

Figure 20:
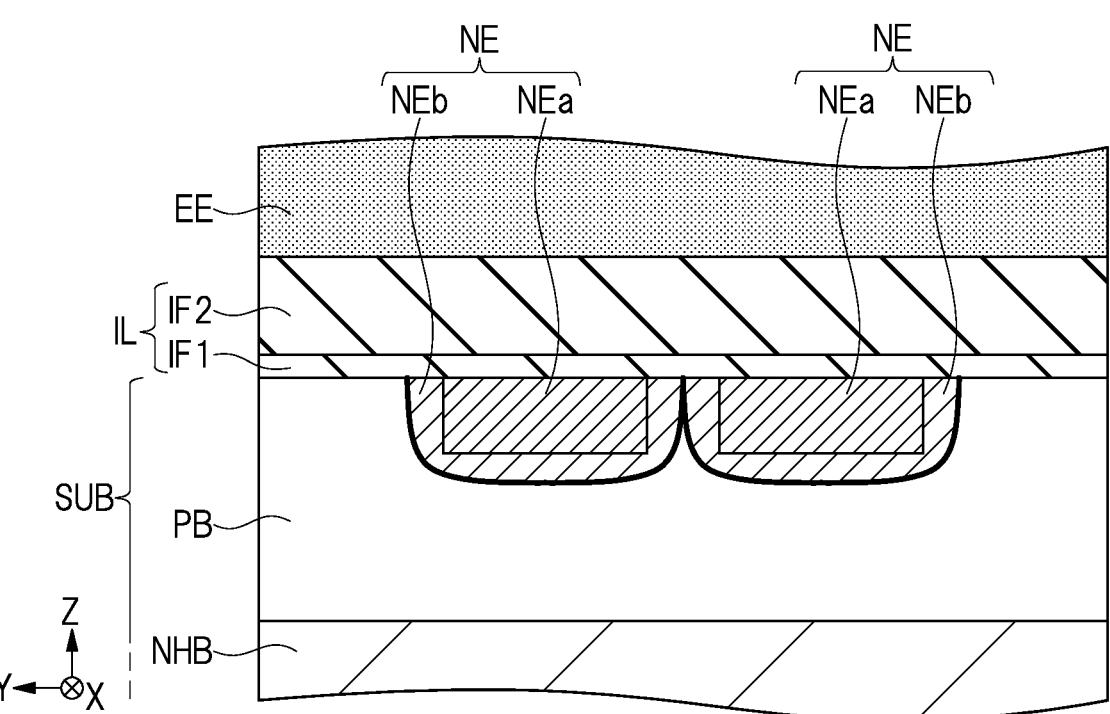
FIG. 20 is a cross-sectional view showing a model of the analysis in FIG. 18.
Figure 21:
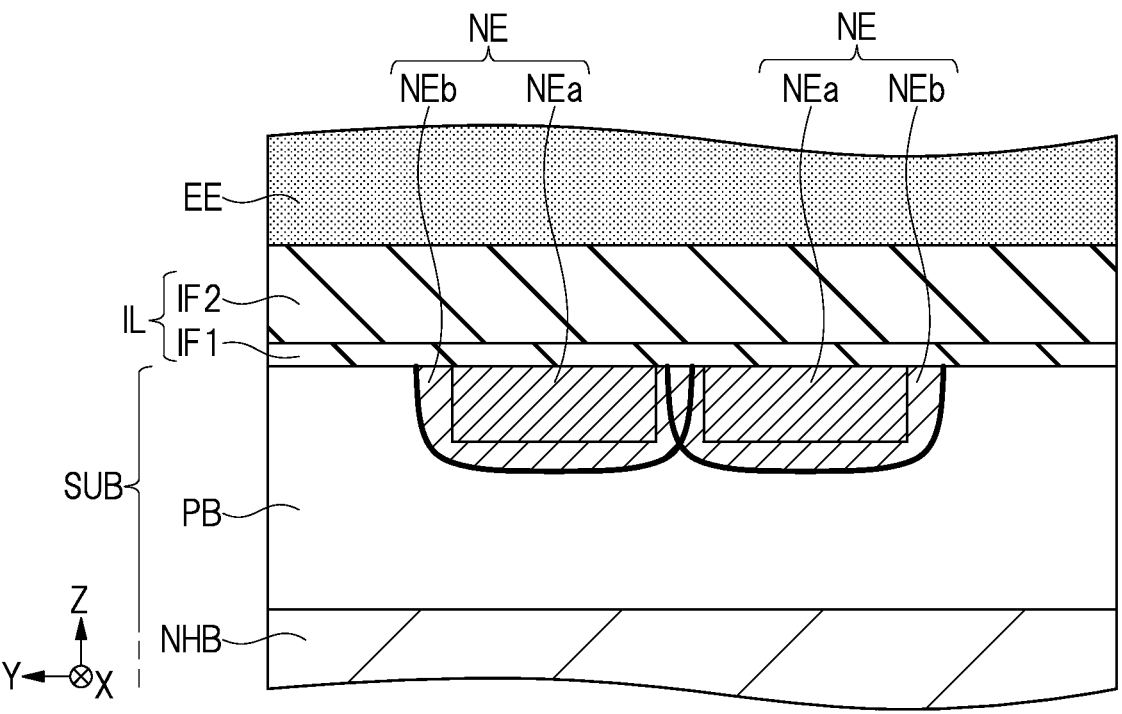
FIG. 21 is a cross-sectional view showing a model of the analysis in FIG. 18.

However, as shown in FIG. 20 and FIG. 21, when the distance L1 is zero or less and adjacent ones of the low concentration regions NEb is in contact with each other, current starts flowing also in the base region PB positioned in the periphery of the contact portion thereof. Specifically, the base region PB positioned in the periphery of the above-mentioned contact portion starts to function as a parasitic channel region. An exposed area of the base region PB as this parasitic channel region is larger, compared to the base region PB positioned below the high concentration region NEa. Hence, an effect of degradation of PBTI is more significant. In other words, referring to FIG. 17, at the above-mentioned contact portion, the position of the boundary 10 is regarded as being at a position closer to the upper surface of the semiconductor substrate SUB. Hence, the effect of degradation of PBTI is more significant.

Figure 22:
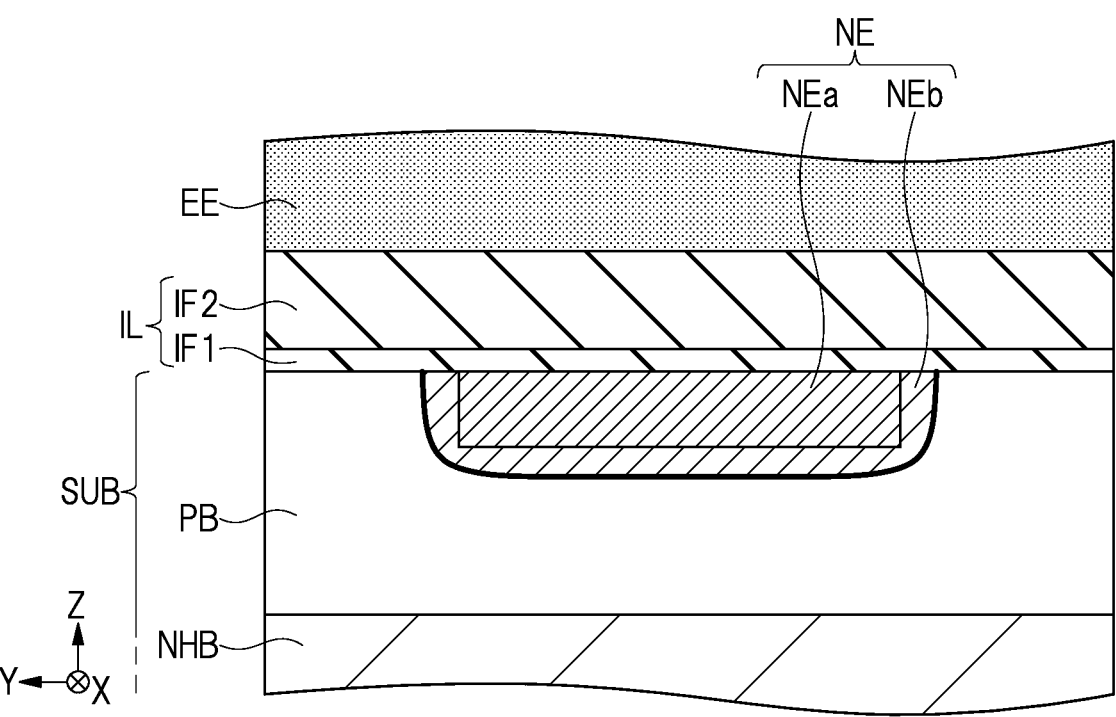
FIG. 22 is a cross-sectional view showing a model of the analysis in FIG. 18.

As shown in FIG. 22, the two emitter regions NE are made much closer to each other in such a manner that the high concentration regions NEa overlap with each other, so that fluctuation of the threshold voltage can be prevented to such a degree substantially same as the case 1. That is, if a portion greatly affected by degradation of PBTI is covered with the high concentration region NEa, a difference between the case 1 and the case 4 is only the gate width (the width W1 of the emitter region NE).

In this manner, the width W1 is set wide to increase the effective gate width, so that an obtained current amount can be increased. At the same time, the distance L1 is set to an appropriate value, so that fluctuation of the threshold voltage due to degradation of PBTI can be kept to the minimum. That is, prevention of fluctuation of the threshold voltage and enhancement of short circuit withstand time can be both achieved. Accordingly, it is possible to secure reliability of the semiconductor device 100 and enhance the performance of the semiconductor device 100.

In the first embodiment, the width W1a is, for example, 1.0 μm, the width W1b is, for example, 0.2 μm, and the width W1 is, for example, 1.4 μm. From a perspective of keeping the effect of degradation of PBTI to the minimum, the distance L1 may preferably be wider than ⅓ of the width W1. In addition, taking into consideration misalignment of the mask, a margin relative to a diffusion coefficient of the low concentration region NEb, and the like, the distance L1 may preferably be 0.2 μm or more.

Meanwhile, when the distance L1 is set too wide, a proportion of the entire gate width in the active cell AC is small, and an obtained current amount is lowered. In view of this, the distance L1 may preferably be narrower than the width W1. That is, in the first embodiment, such a relation as "width W1⅓<distance L1<width W1" may preferably be satisfied. Also, the distance L1 may preferably be 0.2 μm or more as the lower limit value.

Second Embodiment

With reference to FIG. 23 to FIG. 26, the semiconductor device 100 according to the second embodiment will be described below. Note that, in the following description, a difference from the first embodiment will mainly be described, and overlapping description with the first embodiment will be omitted.

In the second embodiment, compared to the first embodiment, the emitter region NE is formed deeper. Hence, ion implantation for the emitter region NE is carried out twice. The first ion implantation is carried out with use of arsenic under a condition in which an energy is set at 100 keV and the dose amount is set to be $1 \times 10^{15}$ cm$^2$ or more and $5 \times 10^{15}$ cm$^2$ or less. The second ion implantation is carried out with use of phosphorus under a condition in which an energy is set at 70 keV and the dose amount is set to be $1 \times 10^{14}$ cm$^2$ or more and $1 \times 10^{15}$ cm$^2$ or less.

Figure 23:
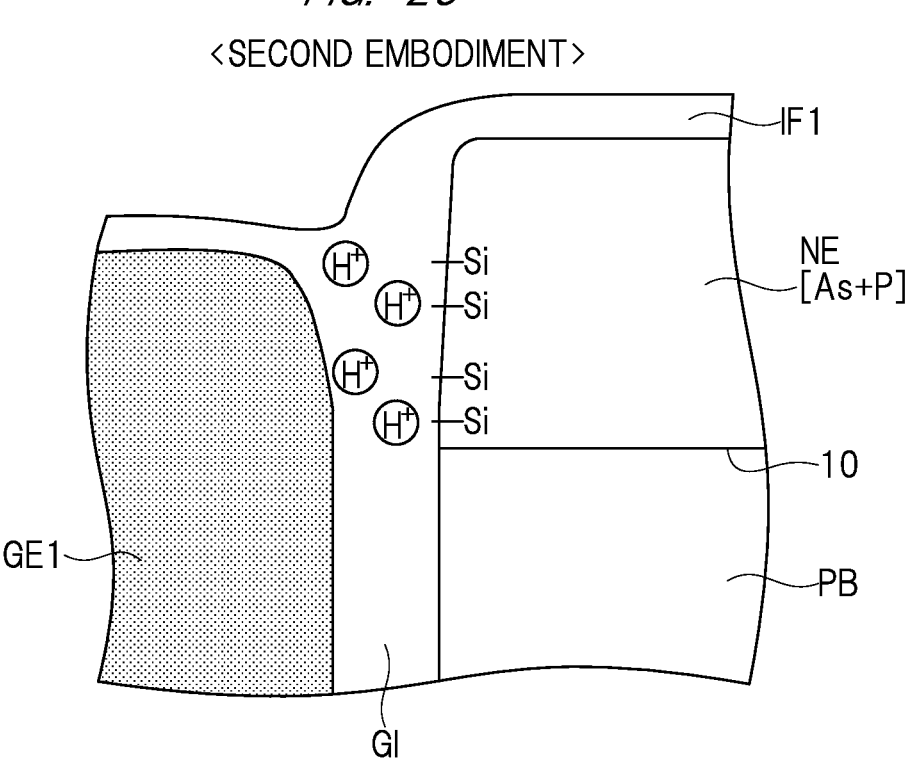
FIG. 23 is an enlarged cross-sectional view showing a model of degradation of PBTI of a semiconductor device according to a second embodiment.

As shown in FIG. 23, in the second embodiment, the boundary 10 between the base region PB and the emitter region NE is positioned at 300 nm or more and 500 nm or less from the upper surface of the semiconductor substrate SUB. Thus, the position of the boundary 10 is set to be deep, it is possible to use a portion where degradation of PBTI rarely occurs as a channel region, without using a portion where fluctuation of the threshold voltage is likely to occur due to degradation of PBTI as a channel region.

Figure 24:
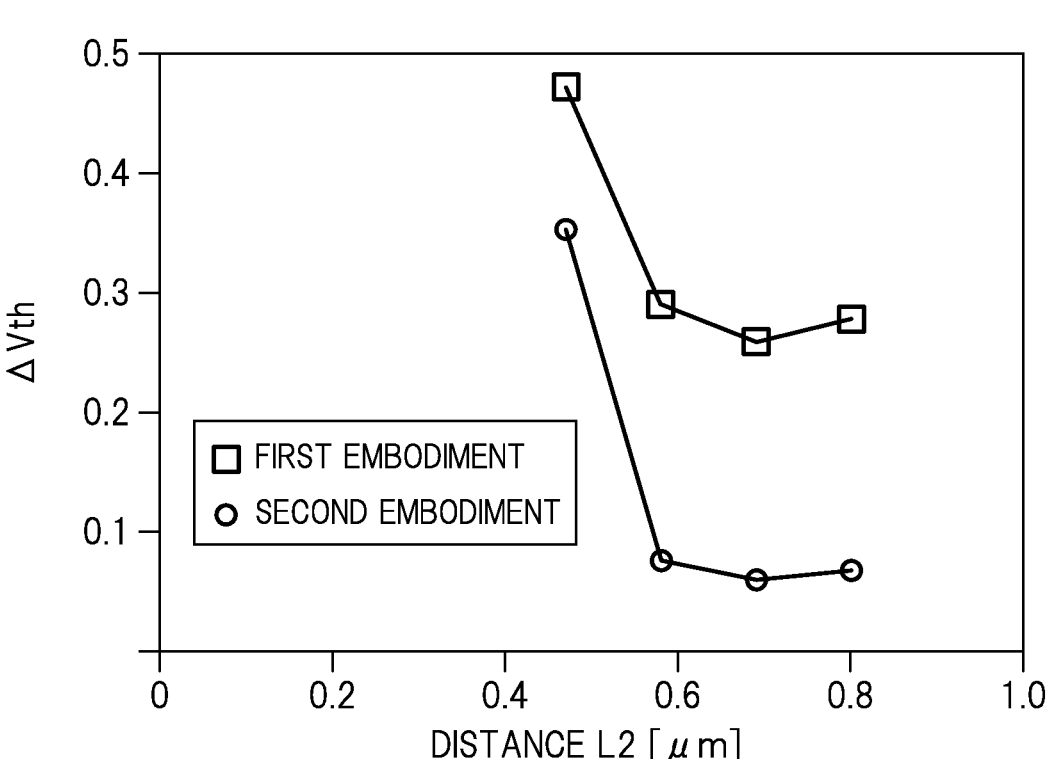
FIG. 24 is a graph showing a result obtained by analyzing degradation of PBTI.

FIG. 24 is a graph showing fluctuation of the threshold voltage in each of the first embodiment and the second embodiment. In the second embodiment (white circle), compared to the first embodiment (white square), it is clear that fluctuation of the threshold voltage is suppressed. Hence, reliability of the semiconductor device 100 can further be enhanced.

Figure 25:
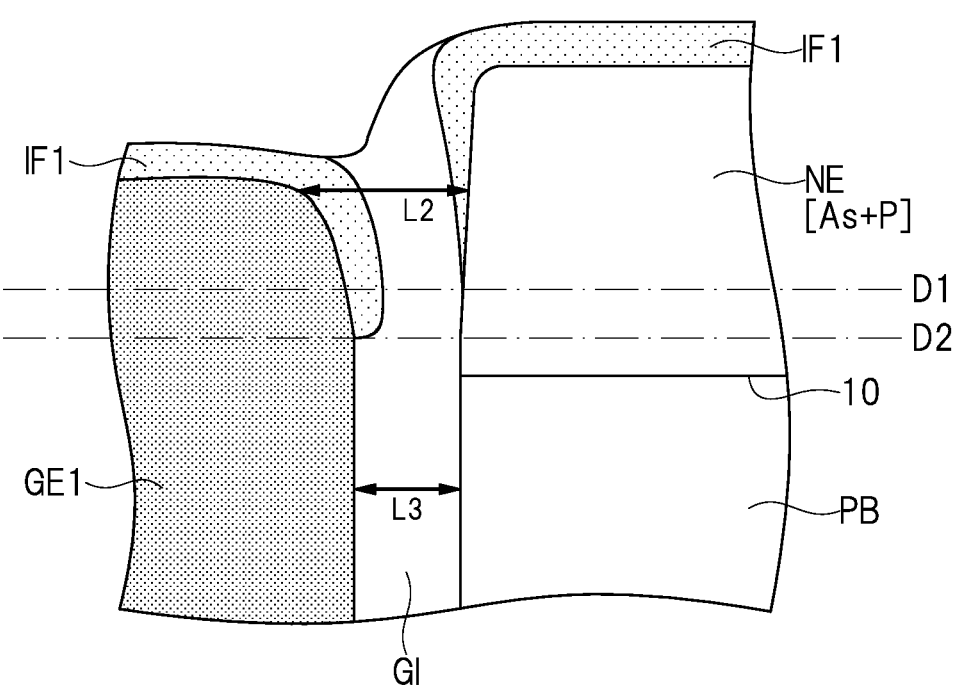
FIG. 25 is an enlarged cross-sectional view showing a depth relation among components according to the second embodiment.
Figure 26:
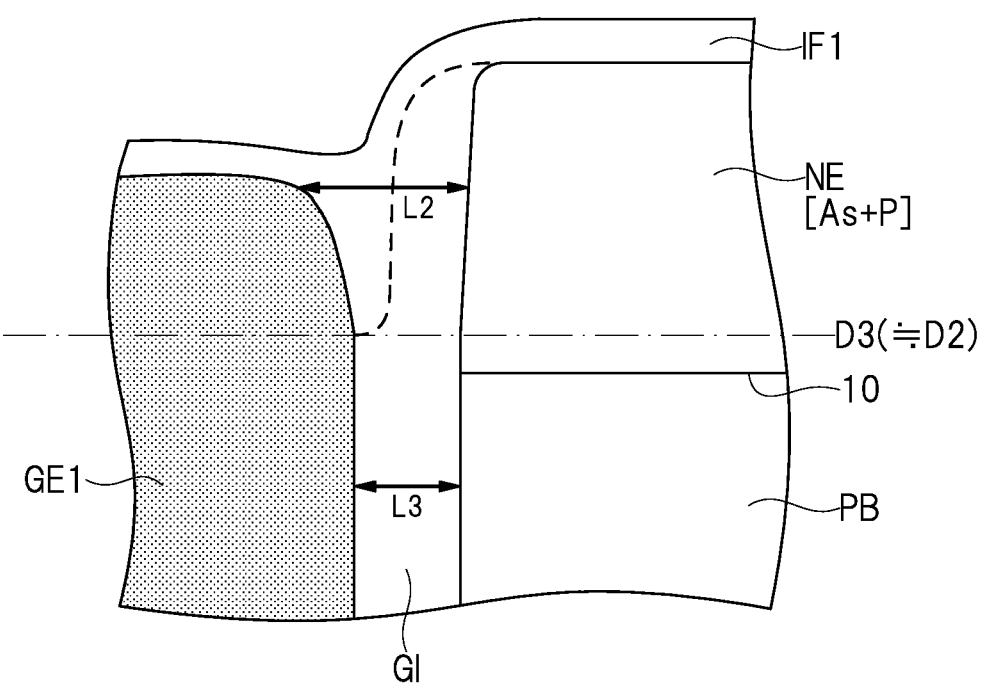
FIG. 26 is an enlarged cross-sectional view showing the depth relation among the components according to the second embodiment.

Note that, as shown in FIG. 25, in the second embodiment, the boundary 10 is positioned deeper than the depths D1 and D2 of the insulating film IF1. In addition, as shown in FIG. 26, the boundary 10 is positioned deeper than the exposed portion of the side surface of the gate electrode GE1 shown in FIG. 12 (depth D3).

That the boundary 10 is positioned deeper than the insulating film IF1 can also be said as described below, for example. As shown in FIG. 25 and FIG. 26, due to the dry oxidation treatment, a distance L2 between the gate electrode GE1 which is positioned on the upper side of the boundary 10 and the emitter region NE is wider than a distance L3 between the gate electrode GE1 which is positioned on the lower side of the boundary 10 and the base region PB. In addition, the distance L2 becomes wider as it is closer to the upper surface of the gate electrode GE1. Moreover, in other words, on the upper side of the boundary 10, the width of the gate electrode GE1 is narrower as it is closer to the upper surface of the gate electrode GE1. A difference between the distance L2 at the upper surface of the gate electrode GE1 and the distance L3 is 30 nm or more and 100 nm or less.

Third Embodiment

Figure 27:
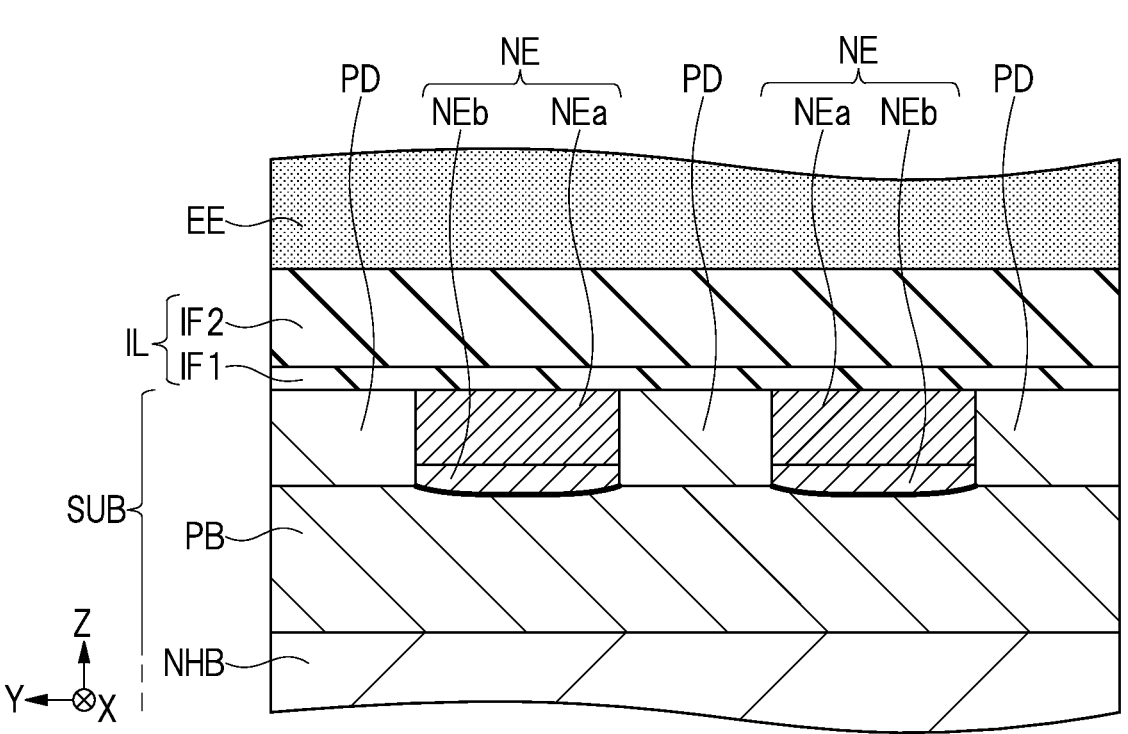
FIG. 27 is a cross-sectional view showing a main part of a semiconductor device according to a third embodiment.

With reference to FIG. 27, the semiconductor device 100 according to the third embodiment will be described. Note that, in the following description, a difference from the first embodiment will mainly be described, and overlapping description with the first embodiment will be omitted. FIG. 27 is a cross-sectional view taken along the line B-B shown in FIG. 2.

As shown in FIG. 27, in the third embodiment, a counter doped region PD is formed between adjacent ones of the plurality of emitter regions NE. The counter doped region PD is a p-type impurity region having an impurity concentration lower than that of the base region PB, or an intrinsic semiconductor region. In addition, the counter doped region PD is formed so as to be shallower than the base region PB and deeper than the high concentration region NEa.

The counter doped region PD described above is formed after the formation process of the base region PB or the formation process of the emitter region by doping the base region PB with p-type impurities such as boron by the ion implantation, for example. The impurity concentration of the counter doped region PD is set such that a region that is the low concentration region NEb in the first embodiment is inverted to a p-type impurity region or becomes such a degree as to cancel the impurity concentration of the low concentration region NEb.

Presence of the counter doped region PD can lower a possibility that adjacent ones of the plurality of emitter regions NE are in contact with each other. Accordingly, fluctuation of the threshold voltage due to degradation of PBTI can be easily suppressed. In addition, the width W1b of the low concentration region NEb in the Y direction does not have to be taken into consideration, so that adjacent ones of the emitter regions NE can be made closer to each other by the amount of the width W1b.

In addition, the technique described in the third embodiment may be applied in combination with the technique described in the second embodiment.

First Modification Example

Figure 28:
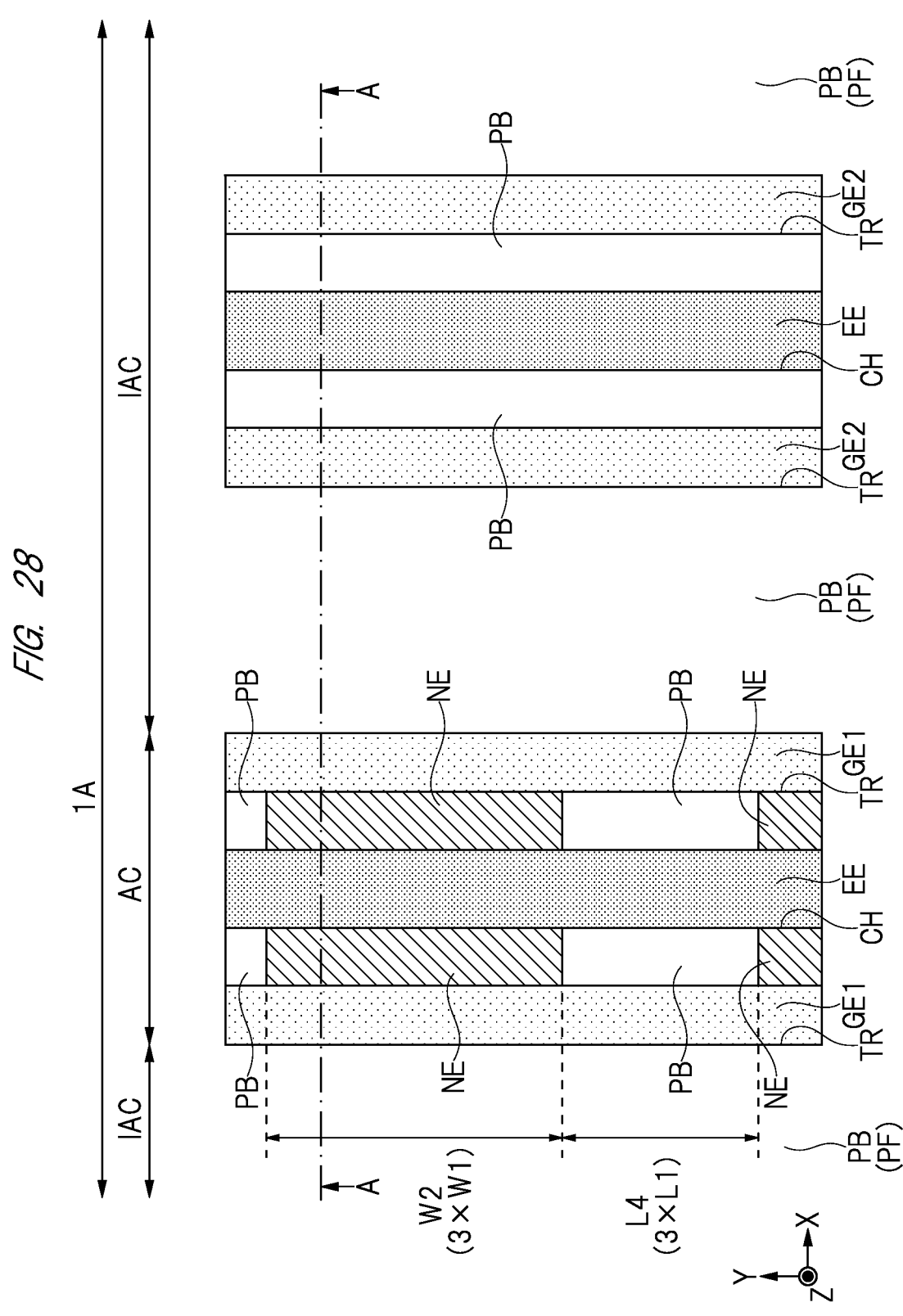
FIG. 28 is a plan view showing a main part of a semiconductor device according to a first modification example.

With reference to FIG. 28, the semiconductor device 100 according to the first modification example of the first embodiment will be described below.

In the first modification example, a width of the emitter region NE in the Y direction is a width W2. In addition, a distance at which adjacent ones of the plurality of emitter regions NE in the Y direction are spaced apart from each other is a distance L4. The width W2 is substantially three times the width W1 in the first embodiment, and the distance L4 is substantially three times the distance L1 in the first embodiment.

In this manner, even in a case in which the width W2 and the distance L4 are made wider at the same proportion, the entire gate width of the active cell AC is the same as that in the first embodiment, and accordingly, the obtained current amount remains unchanged. Hence, also in the first modification example, both suppression of the threshold voltage due to degradation of PBTI and enhancement of short circuit withstand time can be achieved.

In addition, the technique described in the first modification example may be applied in combination with the techniques described in the second embodiment and the third embodiment.

Second Modification Example

Figure 29:
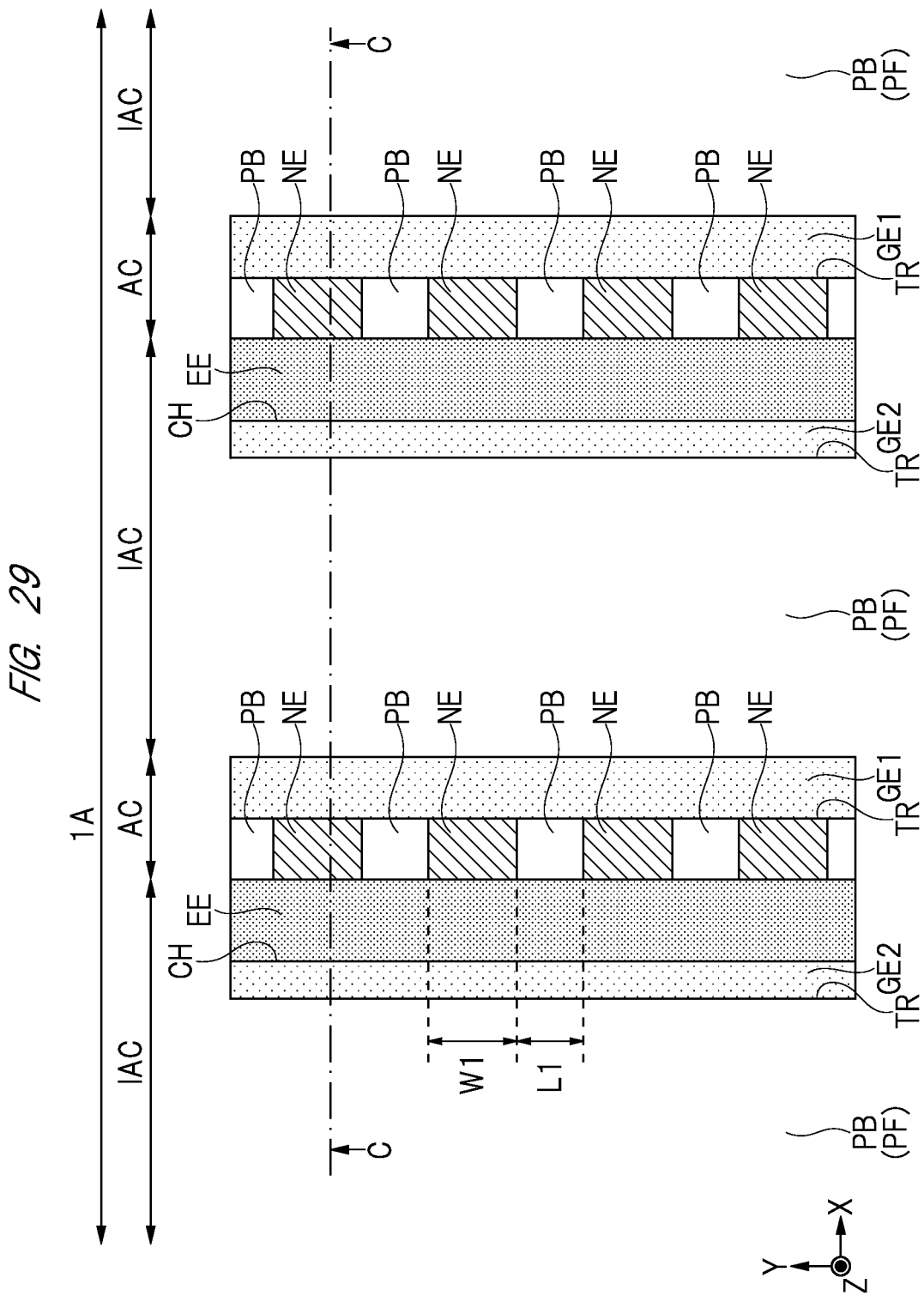
FIG. 29 is a plan view showing a main part of a semiconductor device according to a second modification example.
Figure 30:
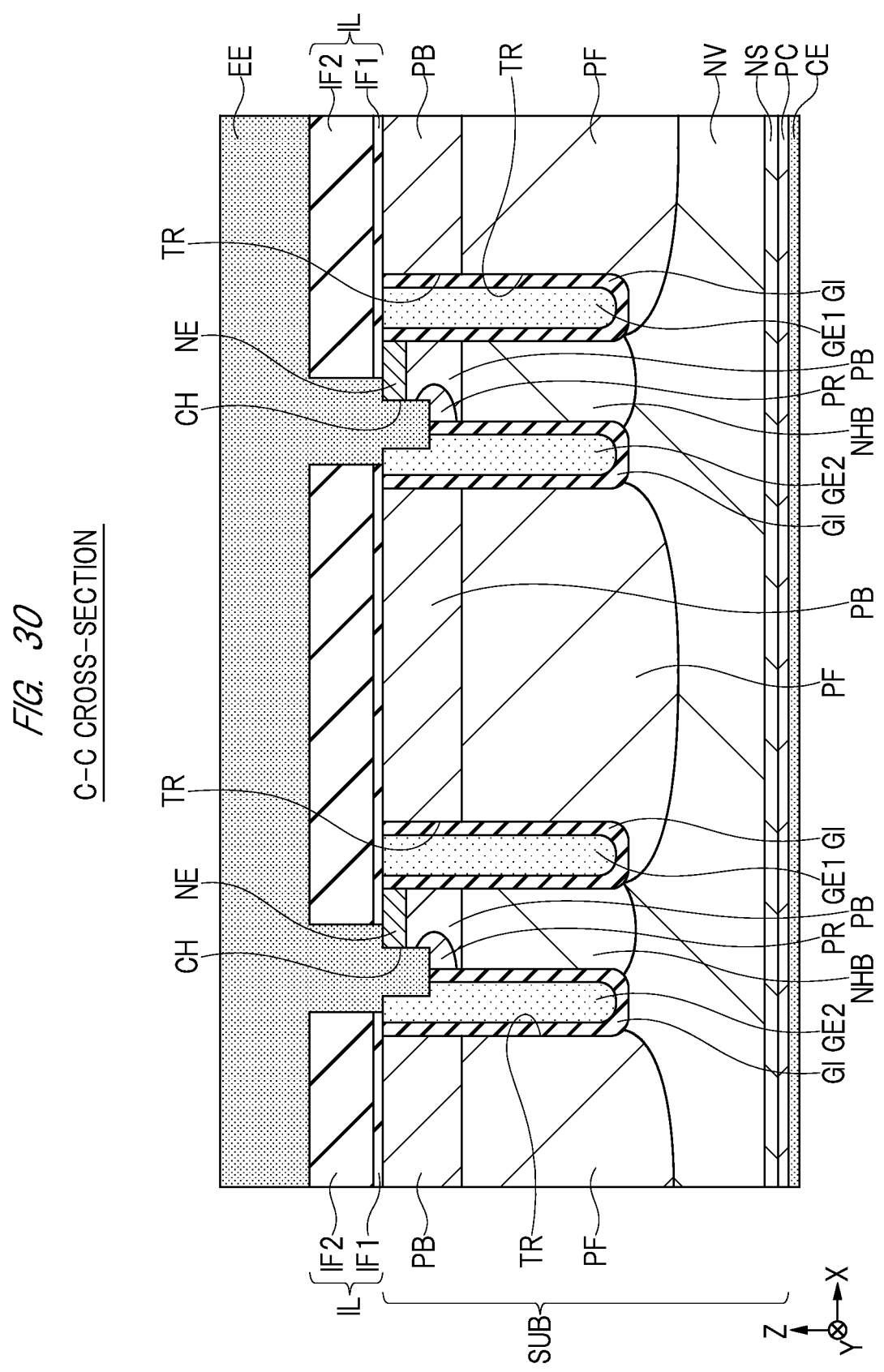
FIG. 30 is a plan view showing a main part of a semiconductor device according to the second modification example.

With reference to FIG. 29 and FIG. 30, the semiconductor device 100 according to the second modification example of the first embodiment will be described below. FIG. 30 is a cross-sectional view taken along a line C-C shown in FIG. 29.

In the first embodiment, the IGBT having the GGEE structure has been described. The technique of this application can also be applied to an IGBT having another structure. In the second modification example, a GE structure IGBT will be described.

As shown in FIG. 29 and FIG. 30, in the second modification example, the trench TR and the gate electrode GE2 in the inactive cell IAC are adjacent to the trench TR and gate electrode GE1 in the active cell AC in the X direction. The base region PB, the plurality of emitter regions NE, and the high concentration diffusion region PR in the active cell AC are formed between adjacent ones of these trenches TR.

The contact hole CH penetrates the interlayer insulating film IL and the emitter region NE and reaches the base region PB. In addition, the contact hole CH is formed so as to reach part of the upper portion of the gate electrode GE2 as well. Hence, the emitter electrode EE is not only connected to the emitter region NE, the base region PB, and the high concentration diffusion region PR, but also electrically connected to the gate electrode GE2, supplying these regions with an emitter potential.

Also in the second modification example, the relation "width W1/3<distance L1<width W1" is satisfied. Also, the distance L1 may preferably be 0.2 μm or more, as a lower limit value. Accordingly, both suppression of fluctuation of the threshold voltage and enhancement of short circuit withstand time can be achieved.

In addition, the technique described in the second modification example may be applied in combination with the techniques described in the second embodiment, the third embodiment, and the first modification example.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
a semiconductor substrate of a first conductivity type;
a first trench formed in the semiconductor substrate;

16 a first gate insulating film formed in the first trench;
a first gate electrode formed on the first gate insulating film so as to bury an interior of the first trench;
a base region of a second conductivity type which is an opposite conductivity type to the first conductivity type, the base region being formed in the semiconductor substrate such that a bottom portion of the base region is shallower than a bottom portion of the first trench; and
a plurality of emitter regions of the first conductivity type formed in the base region,
wherein the first trench extends in a first direction, in a plan view,
wherein adjacent ones of the plurality of emitter regions are spaced apart from each other by a first distance along the first direction,
wherein each of the plurality of emitter regions has a first width in the first direction,
wherein the first distance is wider than ⅓ of the first width and narrower than the first width,
wherein the semiconductor device further comprises a counter doped region formed between adjacent ones of the plurality of emitter regions, and
wherein the counter doped region is an impurity region of the second conductivity type having an impurity concentration lower than that of the base region, or an intrinsic semiconductor region.

2. The semiconductor device according to claim 1, wherein the first distance is 0.2 μm or more.

3. The semiconductor device according to claim 1,
wherein a second distance between the first gate electrode and each of the plurality of emitter regions on an upper side of a boundary between the base region and each of the plurality of emitter regions is wider than a third distance between the first gate electrode and the base region on a lower side of the boundary,
wherein the second distance becomes wider as it is closer to an upper surface of the first gate electrode, and
wherein a difference between the second distance at the upper surface of the first gate electrode and the third distance is 30 nm or more and 100 nm or less.

4. The semiconductor device according to claim 3, wherein the plurality of emitter regions include both arsenic and phosphorus.

5. The semiconductor device according to claim 1, comprising:
a second trench formed in the semiconductor substrate;
a second gate insulating film formed in the second trench; and
a second gate electrode formed on the second gate insulating film so as to bury an interior of the second trench,
wherein the second trench extends in the first direction and is adjacent to the first trench in a second direction orthogonal to the first direction, in a plan view,
wherein the base region and the plurality of emitter regions are formed between the first trench and the second trench,
wherein each of the first gate electrode and the second gate electrode is supplied with a gate potential, and
wherein each of the base region and the plurality of emitter regions is supplied with an emitter potential.

6. The semiconductor device according to claim 1, comprising:
a second trench formed in the semiconductor substrate;
a second gate insulating film formed in the second trench; and a second gate electrode formed on the second gate insulating film so as to bury an interior of the second trench, wherein the second trench extends in the first direction and is adjacent to the first trench in a second direction orthogonal to the first direction, in a plan view, wherein the base region and the plurality of emitter regions are formed between the first trench and the second trench, wherein the first gate electrode is supplied with a gate potential, and wherein each of the base region, the plurality of emitter regions, and the second gate electrode is supplied with an emitter potential.

\* \* \* \* \*